(12) United States Patent
Ausserlechner et al.

(10) Patent No.: US 9,865,802 B2
(45) Date of Patent: Jan. 9, 2018

(54) CURRENT SENSORS AND METHODS

(71) Applicant: Infineon Technologies AG, Neubiberg (DE)

(72) Inventors: Udo Ausserlechner, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 924 days.

(21) Appl. No.: 14/267,610

(22) Filed: May 1, 2014

(65) Prior Publication Data
US 2014/0239426 A1 Aug. 28, 2014

Related U.S. Application Data

(63) Continuation of application No. 12/711,471, filed on Feb. 24, 2010, now Pat. No. 8,717,016.

(51) Int. Cl.
*H01L 23/02* (2006.01)
*H01L 43/04* (2006.01)
(Continued)

(52) U.S. Cl.
CPC ............ *H01L 43/04* (2013.01); *G01R 15/202* (2013.01); *G01R 15/207* (2013.01); *H01L 43/14* (2013.01);
(Continued)

(58) Field of Classification Search
CPC ...... H01L 21/00; H01L 2221/00; H02M 1/00; G01R 1/00
See application file for complete search history.

(56) References Cited

U.S. PATENT DOCUMENTS 3,323,057 A  5/1967  Haley
4,559,495 A 12/1985  Liehard
(Continued)

FOREIGN PATENT DOCUMENTS

DE  198 21 492 A1  11/1999
DE  199 46 935 A1   5/2001
(Continued)

OTHER PUBLICATIONS

Steiner et al., "Fuller Packaged CMOS Current Monitor Using Lead-On-Chip Technology," *Physical Electronics Laboratoy*, pp. 603-608, © 1998.
(Continued)

*Primary Examiner* — Jermele M Hollington
*Assistant Examiner* — Temilade Rhodes-Vivour
(74) *Attorney, Agent, or Firm* — Eschweiler & Potashnik, LLC

(57) ABSTRACT

Embodiments relate to current sensors and methods. In an embodiment, a current sensor comprises a leadframe; a semiconductor die coupled to the leadframe; a conductor comprising a metal layer on the semiconductor die, the conductor comprising at least one bridge portion and at least two slots, a first slot having a first tip and a second slot having a second tip, a distance between the first and second tips defining a width of one of the at least one bridge portion, wherein the conductor is separated from the leadframe by at least a thickness of the semiconductor die, and the thickness is about 0.2 millimeters (mm) to about 0.7 mm; and at least one magnetic sensor element arranged on the die relative to and spaced apart from the one of the at least one bridge portion and more proximate the conductor than the leadframe.

18 Claims, 29 Drawing Sheets

(51) Int. Cl.
  *G01R 15/20* (2006.01)
  *H01L 43/14* (2006.01)
  *G01R 1/00* (2006.01)
  *H01L 21/00* (2006.01)
  *H01L 23/00* (2006.01)

(52) U.S. Cl.
  CPC ............... *G01R 1/00* (2013.01); *H01L 21/00* (2013.01); *H01L 24/49* (2013.01); *H01L 2221/00* (2013.01); *H01L 2224/4813* (2013.01); *H01L 2224/48091* (2013.01); *H01L 2224/48247* (2013.01); *H01L 2224/48464* (2013.01); *H01L 2224/49111* (2013.01); *H01L 2224/73265* (2013.01); *H01L 2924/00014* (2013.01); *H01L 2924/01029* (2013.01); *H01L 2924/01068* (2013.01); *H01L 2924/14* (2013.01); *H01L 2924/181* (2013.01); *H01L 2924/19041* (2013.01); *H01L 2924/3011* (2013.01); *H01L 2924/3025* (2013.01)

(56) References Cited

U.S. PATENT DOCUMENTS

| | | | |
|---|---|---|---|
| 4,894,610 | A | 1/1990 | Friedl |
| 5,017,804 | A | 5/1991 | Harnden |
| 5,041,780 | A | 8/1991 | Rippel |
| 5,173,758 | A | 12/1992 | Heremans |
| 5,642,041 | A | 6/1997 | Berkcan |
| 5,786,976 | A | 7/1998 | Field |
| 5,963,028 | A | 10/1999 | Engel et al. |
| 6,310,470 | B1 | 10/2001 | Hebing |
| 6,341,416 | B1 | 1/2002 | Biskeborn et al. |
| 6,356,068 | B1 | 3/2002 | Steiner et al. |
| 6,424,018 | B1 | 7/2002 | Ohtsuka |
| 6,452,413 | B1 | 9/2002 | Burghartz |
| 6,462,531 | B1 | 10/2002 | Ohtsuka |
| 6,512,359 | B1 | 1/2003 | Tamai et al. |
| 6,636,029 | B1 | 10/2003 | Kunze |
| 6,683,448 | B1 | 1/2004 | Ohtsuka |
| 6,727,683 | B2 | 4/2004 | Goto |
| 6,781,358 | B2 | 8/2004 | Goto |
| 6,841,989 | B2 | 1/2005 | Goto |
| 6,940,265 | B2 | 9/2005 | Hauenstein |
| 6,949,927 | B2 | 9/2005 | Goetz |
| 6,995,315 | B2 | 2/2006 | Sharma et al. |
| 7,075,287 | B1 | 7/2006 | Mangtani et al. |
| 7,129,691 | B2 | 10/2006 | Shibahara |
| 7,166,807 | B2 | 1/2007 | Gagnon |
| 7,259,545 | B2 | 8/2007 | Stauth |
| 7,358,724 | B2 | 4/2008 | Taylor et al. |
| 7,375,507 | B2 | 5/2008 | Racz |
| 7,474,093 | B2 | 1/2009 | Ausserlechner |
| 7,476,816 | B2 | 1/2009 | Doogue |
| 7,476,953 | B2 | 1/2009 | Taylor |
| 7,492,178 | B2 | 2/2009 | Bidenbach |
| 7,528,593 | B2 | 5/2009 | Tanizawa |
| 7,545,136 | B2 | 6/2009 | Racz et al. |
| 7,564,239 | B2 | 7/2009 | Mapps et al. |
| 7,605,580 | B2 | 10/2009 | Strzalkowski |
| 7,709,754 | B2 | 5/2010 | Doogue et al. |
| 7,746,056 | B2 | 6/2010 | Stauth et al. |
| 7,816,905 | B2 | 10/2010 | Doogue et al. |
| 7,923,987 | B2 | 4/2011 | Ausserlechner |
| 8,159,254 | B2 | 4/2012 | Kaltalioglu |
| 8,217,643 | B2 | 7/2012 | Kuroki et al. |
| 8,283,742 | B2 | 10/2012 | Motz et al. |
| 2001/0052780 | A1 | 12/2001 | Hayat-Dawoodi |
| 2003/0155905 | A1 | 8/2003 | Hauenstein |
| 2005/0236644 | A1* | 10/2005 | Getten ............... B81B 7/007 257/106 |
| 2005/0248336 | A1* | 11/2005 | Sharma ............... G01R 15/202 324/117 H |
| 2005/0270013 | A1 | 12/2005 | Berkcan et al. |
| 2005/0270014 | A1 | 12/2005 | Zribi et al. |
| 2006/0076947 | A1 | 4/2006 | Berkcan et al. |
| 2006/0082983 | A1 | 4/2006 | Parkhill |
| 2006/0255797 | A1 | 11/2006 | Taylor et al. |
| 2006/0284613 | A1 | 12/2006 | Hastings et al. |
| 2007/0052379 | A1* | 3/2007 | Suh ............... H02P 27/08 318/400.26 |
| 2007/0063690 | A1 | 3/2007 | De Wilde et al. |
| 2007/0290682 | A1 | 12/2007 | Oohira |
| 2008/0035923 | A1 | 2/2008 | Tschmelitsch et al. |
| 2008/0297138 | A1 | 12/2008 | Taylor et al. |
| 2008/0312854 | A1 | 12/2008 | Chemin et al. |
| 2009/0001962 | A1* | 1/2009 | Dupuis ............... G01R 15/181 324/117 R |
| 2009/0026560 | A1 | 1/2009 | Wombacher et al. |
| 2009/0050990 | A1 | 2/2009 | Aono et al. |
| 2009/0058412 | A1 | 3/2009 | Taylor |
| 2009/0128130 | A1 | 5/2009 | Stauth et al. |
| 2009/0152595 | A1 | 6/2009 | Kaga et al. |
| 2009/0184704 | A1 | 7/2009 | Guo |
| 2009/0212284 | A1* | 8/2009 | Otremba ............ H01L 23/4952 257/48 |
| 2009/0294882 | A1 | 12/2009 | Sterling |
| 2009/0295368 | A1 | 12/2009 | Doogue et al. |
| 2009/0322325 | A1 | 12/2009 | Ausserlechner |
| 2010/0045285 | A1 | 2/2010 | Ohmori et al. |
| 2010/0045286 | A1 | 2/2010 | Hotz et al. |
| 2010/0117638 | A1 | 5/2010 | Yamashita et al. |
| 2010/0156394 | A1 | 6/2010 | Ausserlechner et al. |
| 2010/0231198 | A1 | 9/2010 | Bose et al. |
| 2010/0237853 | A1 | 9/2010 | Bose et al. |
| 2011/0062956 | A1 | 3/2011 | Edelstein |
| 2011/0133732 | A1 | 6/2011 | Sauber |
| 2011/0172938 | A1 | 7/2011 | Gu et al. |
| 2011/0204887 | A1 | 8/2011 | Ausserlechner et al. |
| 2011/0234215 | A1 | 9/2011 | Ausserlechner |
| 2011/0248711 | A1 | 10/2011 | Ausserlechner |
| 2011/0298454 | A1 | 12/2011 | Ausserlechner |
| 2011/0304327 | A1 | 12/2011 | Ausserlechner |
| 2012/0049884 | A1 | 3/2012 | Kaltalioglu |
| 2012/0112365 | A1 | 5/2012 | Ausserlechner et al. |
| 2012/0146164 | A1 | 6/2012 | Ausserlechner |
| 2012/0262152 | A1 | 10/2012 | Ausserlechner |

FOREIGN PATENT DOCUMENTS

| | | |
|---|---|---|
| DE | 10233129 A1 | 2/2003 |
| DE | 102 31 194 A1 | 2/2004 |
| DE | 9946935 | 2/2004 |
| DE | 60 2005 0003 777 T2 | 12/2008 |
| WO | WO 01/23899 A1 | 4/2001 |
| WO | WO 2005/033718 A1 | 4/2005 |
| WO | WO 2008/008140 A2 | 1/2008 |
| WO | WO 2009/088767 A2 | 7/2009 |

OTHER PUBLICATIONS

Lutz et al., "Double-Sided Low-Temperature Joining Technique for Power Cycling Capability at High Temperature," EPE 2005-Dresden, ISBN: 90-75815-08-5.

Schwarzbauer et. al., "Novel Large Area Joining Technique for Improved Power Device Performance" IEEE Transactions on Industry Applications, vol. 27, No. 1, pp. 93-95, 1991.

Allegro, Allegro Hall Effect-Based Current Senssor ICs: Revolutionarv, high accuracy, high bandwidth current sensing!, www.allegomicro.com/en Products/Design/curren_sensors/index.asp, 5 pages, © 2010.

Allegro, Hall-Effect Sensor IC's: Current Sensor ICs, 1 page, © 2010.

Allegro, High Bandwidth, Fast Fault Response Current Sensor IC in Thermally Enhanced Package, ACS709-DS, www.microallegro.com, 16 pages, © 2009.

Allegro, Fully Integrated, Hall Effect-Based Linear Current Sensor IC with 2.1 kVRMS Isolation and a Low-Resistance Current Conductor, ACS712-DS, Rev. 13, 14 pages © 2006-2010.

Sandireddy, Sandhya, IEEE Xplore, © 2005, Advanced Wafer Thinning Technologies to Enable Multichip Packages, pp. 24-27.

(56) References Cited

OTHER PUBLICATIONS

Hopkins, Allegro MicroSystems, Inc., High-Performance Power ICs and Hall-Effect Sensors, "Hall Effect Technology sor Server, Blackplane and Power Supply Applications", IBM 2008 Power and Cooling Symposium, Sep. 30, 2008, 34 pages.
Application and File History of U.S. Appl. No. 12/630,596, filed Dec. 3, 2009. Inventor: Ausserlechner.
Application and File History of U.S. Appl. No. 12/756,652, filed Apr. 8, 2010. Inventor: Ausserlechner.
Application and file History of U.S. Appl. No. 12/813,218, filed Jun. 10, 2010. Inventor: Ausserlechner.
Application and File History of U.S. Appl. No. 12/872,665, filed Aug. 31, 2010. Inventor: Ausserlechner.
Application and File History of U.S. Appl. No. 13/626,456, filed Sep. 25, 2012. Inventor: Motz.
Application and File History of U.S. Appl. No. 12/963,787, filed Dec. 9, 2010. Inventor: Ausserlechner.
Application and File History of U.S. Appl. No. 12/963,817, filed Dec. 9, 2010. Inventor: Ausserlechner.
Application and File History of U.S. Appl. No. 13/012,096, filed Jan. 24, 2011. Inventor: Ausserlechner.
Application and File History of U.S. Appl. No. 13/086,566, filed Apr. 14, 2011. Inventor: Ausserlechner.
Application and File History of U.S. Appl. No. 12/711,471, filed Feb. 24, 2010. Inventors: Ausserlechner et al.

* cited by examiner

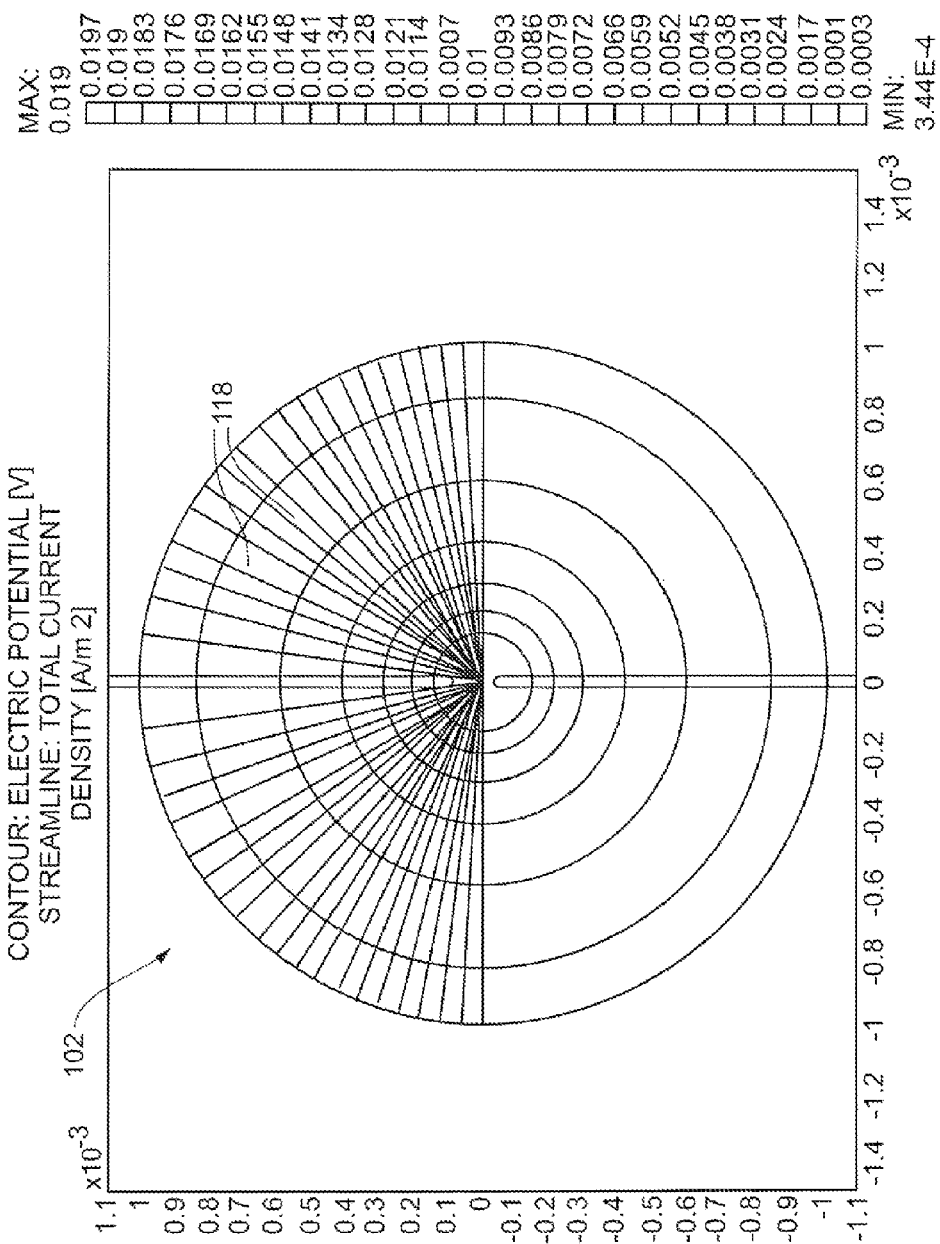

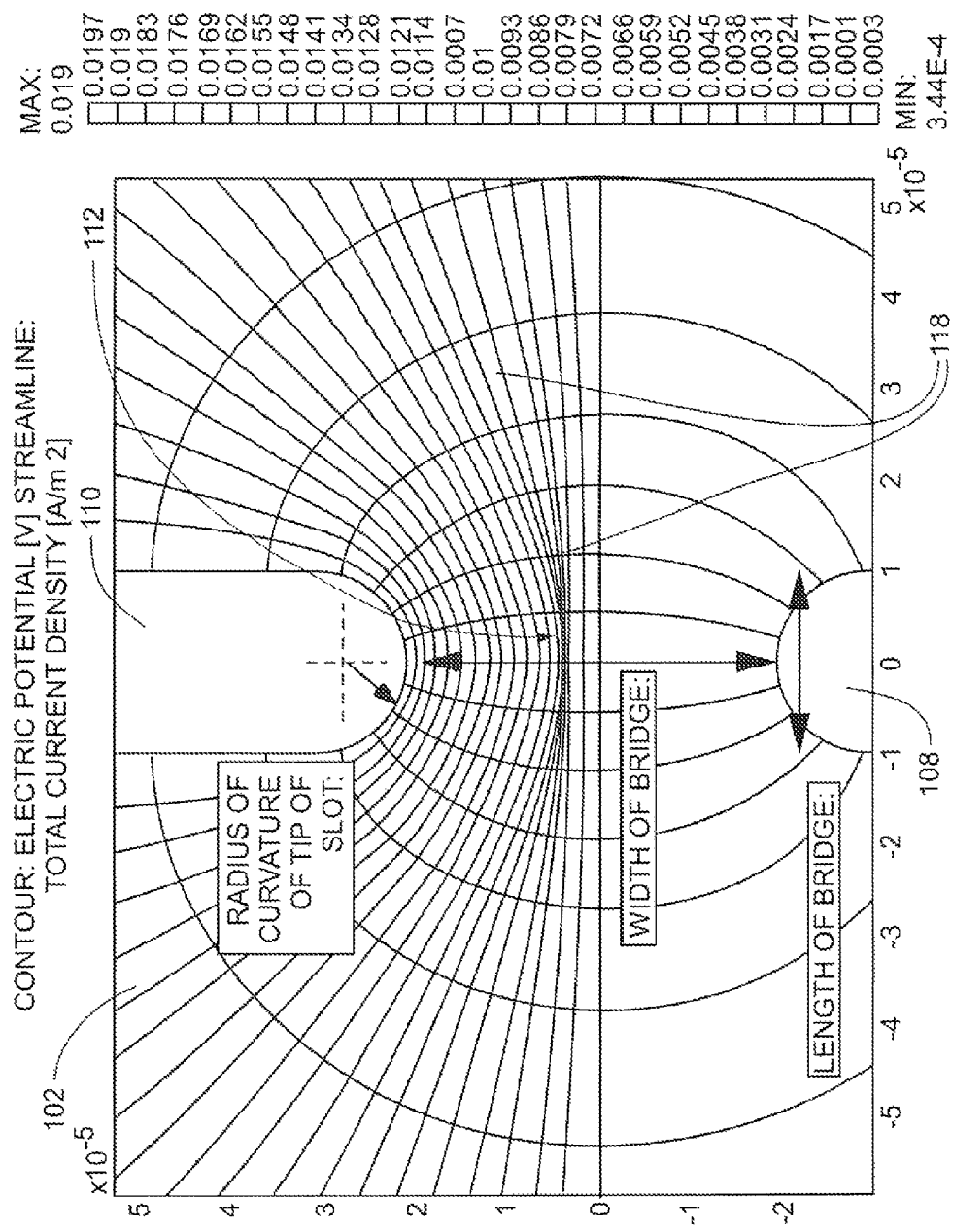

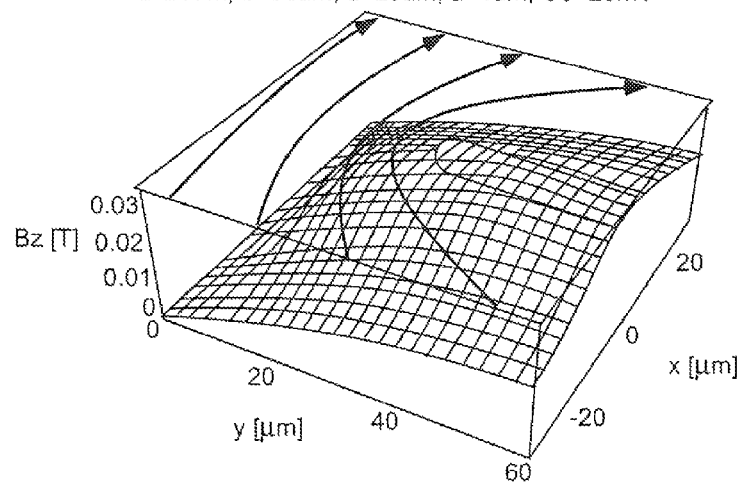
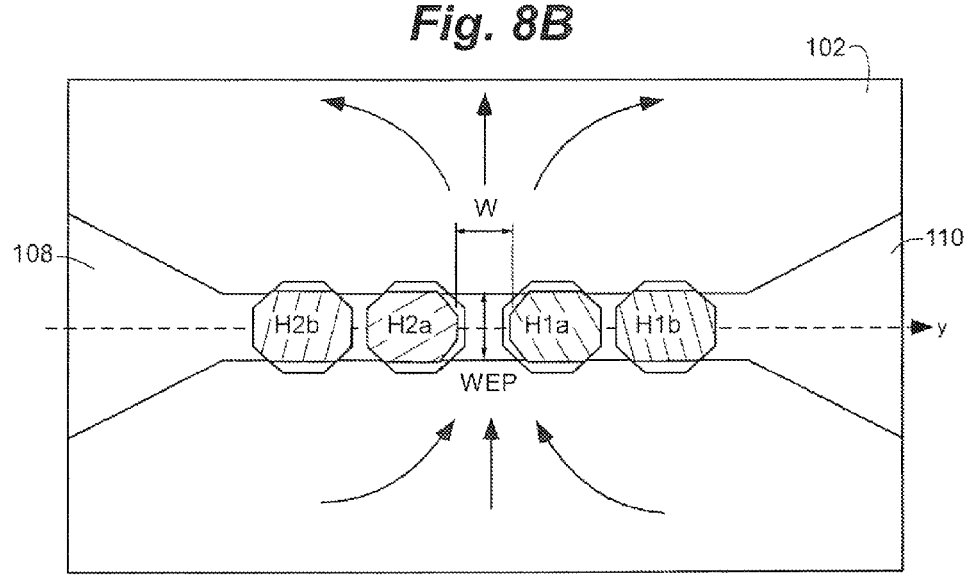

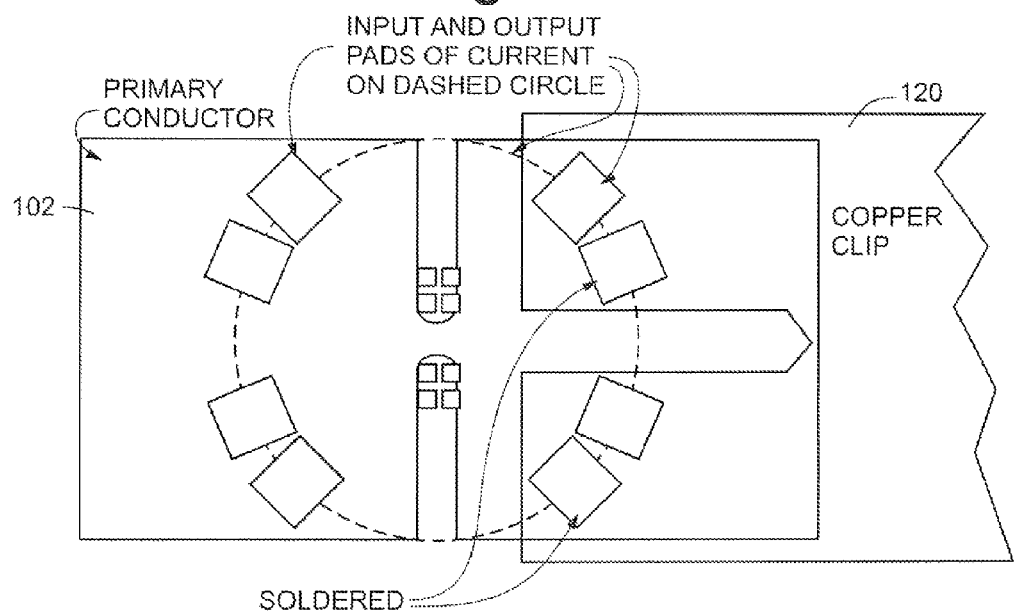
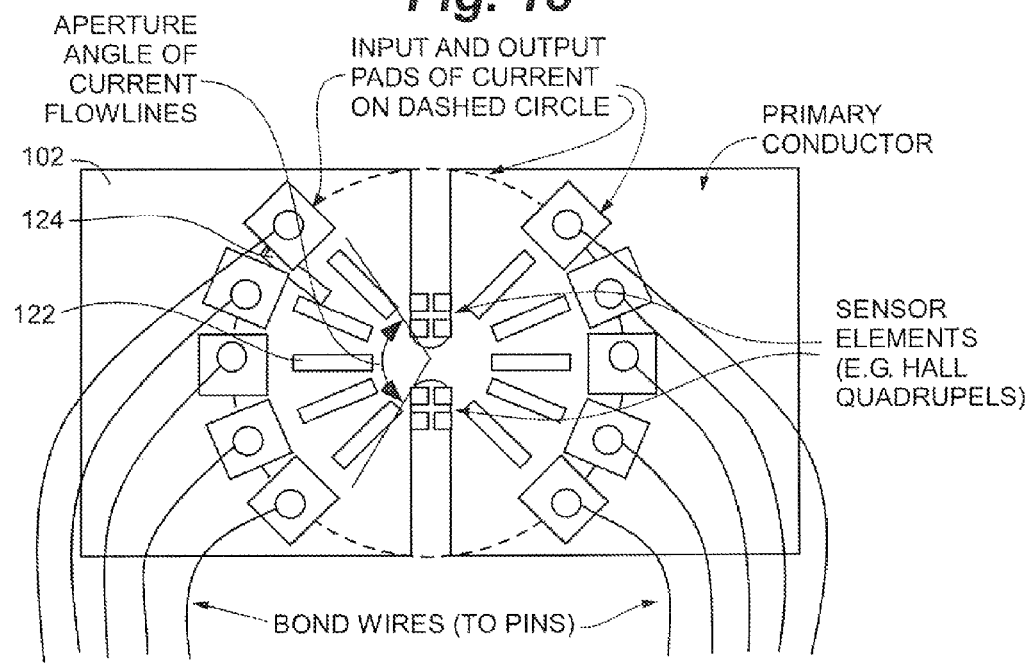

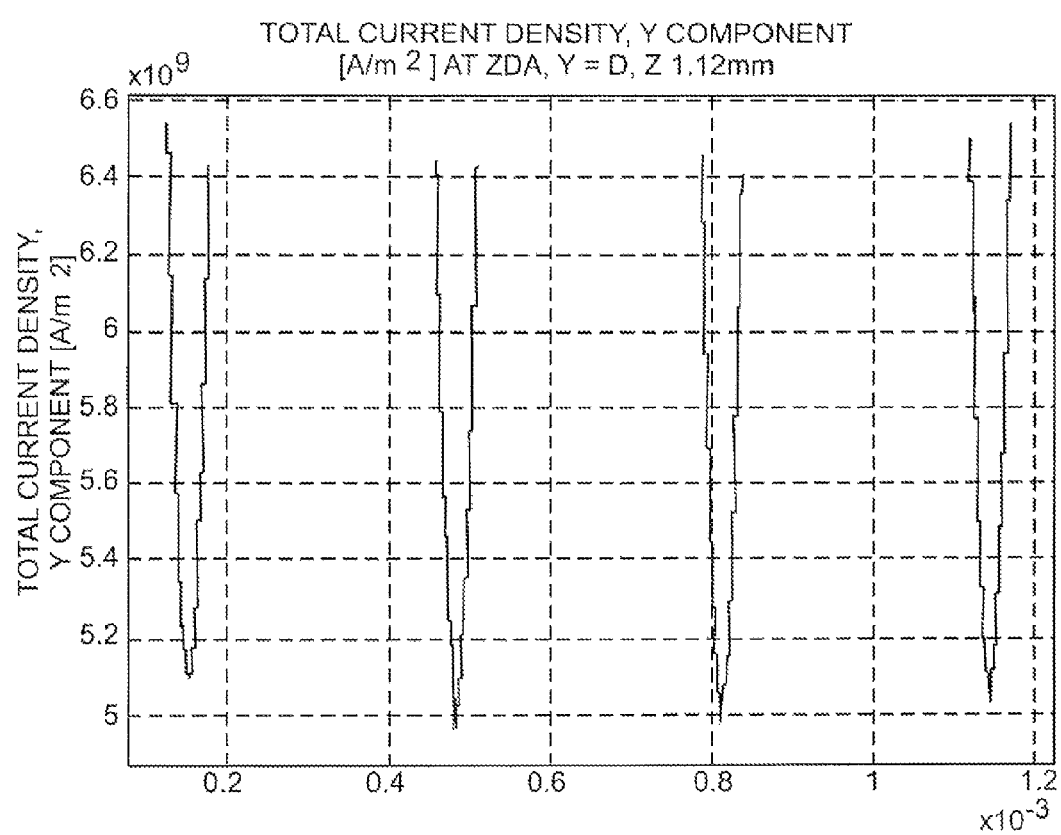

CURRENT SENSORS AND METHODS

RELATED APPLICATION

This application is a continuation of application Ser. No. 12/711,471 filed Feb. 24, 2010, which is hereby fully incorporated herein by reference.

TECHNICAL FIELD

The invention relates generally to current sensors and more particularly to low-current sensors having circular conductor geometries and/or ultra-low resistances.

BACKGROUND

Current sensors sense the magnetic field of a current. In semiconductor current sensors, the semiconductor die must be closely spaced from a current-carrying conductor in order to sense a sufficiently strong magnetic field induced by the current.

Conventional current sensors often include various geometries to attempt to concentrate the current, guide the magnetic field fluxlines or otherwise improve the measurability of the current and/or the magnetic field. Examples include S- or U-shaped conductor geometries that attempt to pass the current through an extended strip of conductor. These and other examples, however, can result in higher than desired electrical and thermal resistances as well as far-reaching fields that result in interference and cross-talk, among other drawbacks. Therefore, a need remains for current sensors with conductor geometries that overcome these and other drawbacks.

SUMMARY

Embodiments relate to current sensors and methods. In an embodiment, a current sensor comprises a leadframe; a semiconductor die coupled to the leadframe; a conductor comprising a metal layer on the semiconductor die, the conductor comprising at least one bridge portion and at least two slots, a first slot having a first tip and a second slot having a second tip, a distance between the first and second tips defining a width of one of the at least one bridge portion, wherein the conductor is separated from the leadframe by at least a thickness of the semiconductor die, and the thickness is about 0.2 millimeters (mm) to about 0.7 mm; and at least one magnetic sensor element arranged on the die relative to and spaced apart from the one of the at least one bridge portion and more proximate the conductor than the leadframe.

In an embodiment, a method of forming a current comprises providing a leadframe having a plurality of pins; coupling a semiconductor die to the leadframe; forming a conductor comprising a metal layer on the semiconductor die, the conductor comprising at least one bridge portion and at least two slots, a first slot having a first tip and a second slot having a second tip, a distance between the first and second tips defining a width of one of the at least one bridge portion, wherein the conductor is separated from the leadframe by at least a thickness of the semiconductor die, and the thickness is about 0.2 millimeters (mm) to about 0.7 mm; coupling the conductor to at least two of the plurality of pins; arranging at least two magnetic sensor elements in the die relative to and spaced apart from the at least one bridge portion and more proximate the conductor than the leadframe; and enclosing the leadframe, the semiconductor die, the conductor and the at least two magnetic field sensor elements in a package such that at least a portion of the plurality of pins are exposed from the package.

BRIEF DESCRIPTION OF THE DRAWINGS

The invention may be more completely understood in consideration of the following detailed description of various embodiments of the invention in connection with the accompanying drawings, in which:

FIG. 2A depicts current streamlines in a conductor according to an embodiment.

FIG. 2B is a detailed view of a portion of FIG. 2A.

FIG. 8A is a diagram of magnetic field at a test point above a conductor according to an embodiment.

FIG. 8B is a diagram of a conductor according to an embodiment.

FIG. 14 is a block diagram of a conductor and clip according to an embodiment.

FIG. 15 is a block diagram of a conductor and bond pads according to an embodiment.

FIG. 20 is a plot of current densities according to an embodiment.

Figure 1:
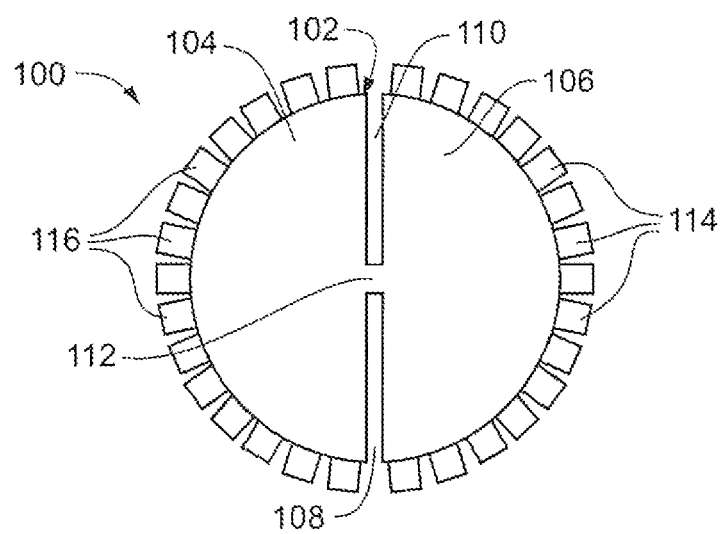
FIG. 1 depicts a current sensor conductor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to current sensors and methods of sensing current. In an embodiment, a current sensor comprises a primary conductor having a generally circular geometry. The primary conductor can be integrated in a standard microelectronic package, minimizes resistances to package pins and minimizes far-reaching fields on nearby conductive elements, neighboring current sensors and/or other components. Embodiments thereby can reduce both frequency distortions due to eddy currents and crosstalk.

Referring to FIG. 1, a portion of a current sensor 100 is depicted. Sensor 100 comprises primary conductor 102 having a first semicircular portion 104 and a second semicircular portion 106. Semicircular portions 104 and 106 are separated by first and second slots 108 and 110 and coupled at the center by a bridge 112. Bridge 112 also separates first and second slots 108 and 110. Current sensor 100 further comprises a plurality of input bond pads 114 and output bond pads 116 spaced along a circumference of conductor 102. In one embodiment, input bond pads 114 arranged along a circumferential portion of second semicircular potion 106 and output bond pads 116 arranged along a circumferential portion of first semicircular portion 104. In other embodiments, the relative positions of the input and output bond pads 114 and 116 are reversed, rotated or otherwise arranged.

Conductor 102 comprises metal in various embodiment. In one embodiment, conductor 102 comprises a top metal layer, such as power metal aluminum, copper or another suitable material, formed during front-end semiconductor manufacturing. An advantage of using a metal layer that is part of CMOS production flow for conductor 102 is that the metal layer can be positioned and aligned very precisely with respect to sensor elements. This becomes important because magnetic fields generated by current flow in conductor 102 can be extremely inhomogeneous, increasing the importance of the relative positioning of magnetic sensor elements and the magnetic field in conductor 102.

The magnetic sensor elements are positioned below conductor 102 in an embodiment such that there is a vertical distance, or isolation gap, between the active volume of the sensor elements and conductor 102. In other words, the sensor elements are formed in an earlier process step in the semiconductor manufacturing. In one embodiment, the isolation gap in sensor 100 is about a few micrometers or more. In embodiments, an electrically isolating layer, such as silicon oxide, silicon nitride or another suitable material, is introduced between conductor 102 and a sensor circuit on the semiconductor die. This layer can provide a voltage isolation of up to several kilovolts between the primary conductor path in conductor 102 and the sensor circuit. In embodiments, it can also be advantageous to have an electrically conducting by magnetically inert (e.g., relative permeability, μr, of close to 1) flat structure between conductor 102 and sensitive parts of the circuit, such as sensor elements and pre-amplifier and other high impedance nodes in the signal path of the circuit. Such a configuration can serve as an electrostatic shield to reduce or eliminate capacitive crosstalk of the conductor path onto the signal path. The shield should be tied to ground for efficiency and, as understood by those skilled in the art, shaped to avoid excessive eddy currents generated by high frequency magnetic fields of conductor 102.

In embodiments, the thickness of primary conductor 102 is greater than the isolation gap to induce sufficiently large magnetic fields on the sensor elements. If the isolation gap is too wide, the magnetic field will decline in strength before reaching the sensor elements, reducing the sensitivity of sensor 100 with respect to primary current to be measured. In an embodiment in which the isolation layer and the shield are fabricated as an integral part of a standard semiconductor process, the isolation gap is about 50 μm. In this embodiment, a thickness of conductor 102 is also about 50 μm thick. In other embodiments, other isolation gap widths and conductor thicknesses are used that are less or greater than 50 μm, such as 20 μm. A maximum thickness of conductor 102 is set by technological limitations and by a nominal current range. In an embodiment, conductor 102 is as thin as possible in order to reduce the distance between the current and the magnetic field sensors; however, internal resistance of conductor 102 is roughly linearly proportional to the thickness of conductor 102, and it is generally desired for the resistance to remain low to avoid excessive heating of sensor package.

Bond pads 114 and 116 are arranged along the circumferential perimeter of conductor 102 and are thereby equidistantly spaced from a center of conductor 102. Additionally, the current density in conductor 102 is homogeneously distributed to the perimeter, which can provide the lowest possible power dissipation in conductor 102. Current streamlines from bridge 112 to bond pads 114 and 116 are straight radial lines, following the shortest and least resistive paths. Current density increases linearly as the current approaches bridge 112, and when the current is near bridge 112 in the center the current density becomes highly inhomogeneous.

In particular, the current increases most near the ends of slots 108 and 110, as depicted in FIGS. 2A and 2B by current streamlines 118. A radius of curvature of the tips can define the amount by which the current density increases because the current takes the shortest path through conductor 102, and this path is adjacent the slot tips, as can be seen by current streamlines 118 in FIG. 2B.

In FIGS. 2A and 2B, the x-axis is in the horizontal direction, and the y-axis in the vertical direction with respect to the orientation on the page. The origin is in the center of bridge 112. Bridge 112 is about 40 μm wide, though the width can vary in other embodiments.

Figure 3A:
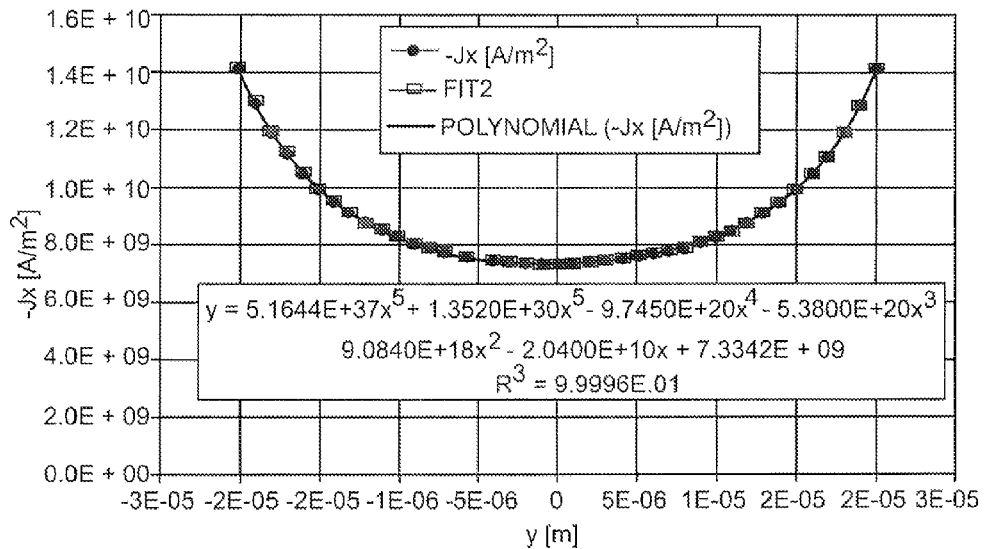
FIG. 3A is a plot of current density according to an embodiment.

FIG. 3A depicts the current density for x=0 along y in FIG. 2B. While the current density is high in the center of bridge 112 (y=0), the density is even higher near the tips of slots 108 and 110, i.e., at each end of the curve in FIG. 3A. For example, at x=0 and y=+/−20 μm, the current density is almost twice that at y=0. The relationship between the maximum current density, Smax, and the minimum current density, 5 min, can be expressed as:

$$\frac{S_{max}}{S_{min}} = \sqrt{1+b/R}$$

This is an approximation for embodiments in which the diameter, 2a, of conductor 102 is much larger than the width, 2b, of bridge 112. In one embodiment, the diameter of conductor 102 is the diameter of the smallest circle circumscribing the contacts of conductor 102. The plot in FIG. 3A also shows that that current density approaches infinity according to the inverse of the square root of the radius, R, of slots 108 and 110 as the tip of slots 108 and 110 becomes pointed. Therefore, current density is amplified in embodiments by increasing the ratio of b to R, as a larger ratio provides higher current density near the tips of slots 108 and 110.

Slots 108 and 110 can also affect the resistance of conductor 102. The electrical resistance, Rel, is defined as:

$$R_{el} = \frac{\rho}{d}\left(\frac{L}{W}\right)_{eff}$$

where ρ is the specific electrical resistivity of the material of conductor 102, such as copper or aluminum in embodiments, and d is the thickness of the material layer. The remaining term is the effective number of squares. A calculation based on conformal mapping theory provides the following:

$$\left(\frac{L}{W}\right)_{eff} = \frac{\ln\frac{2a}{b\sqrt{1+R/b}}}{\arcsin\frac{1}{\sqrt{1+R/b}}}$$

Figure 3B:
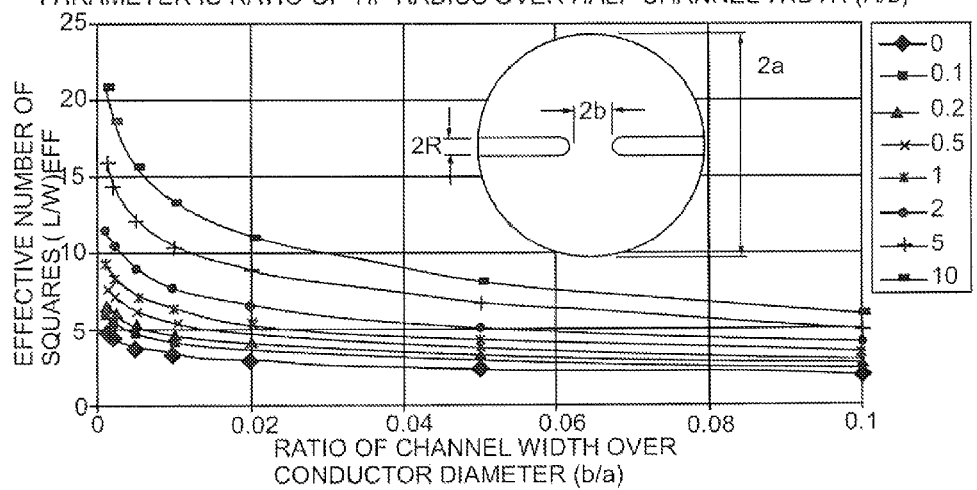
FIG. 3B is a plot of the ratio of channel width to conductor diameter versus effective number of squares according to an embodiment.

This relationship is shown in FIG. 3B. As can be seen, resistance increases as channel width, or the width of slots 108 and 110, decreases or if the radius of the ends of slots 108 and 110, and thus the channel length, increases.

Figure 4:
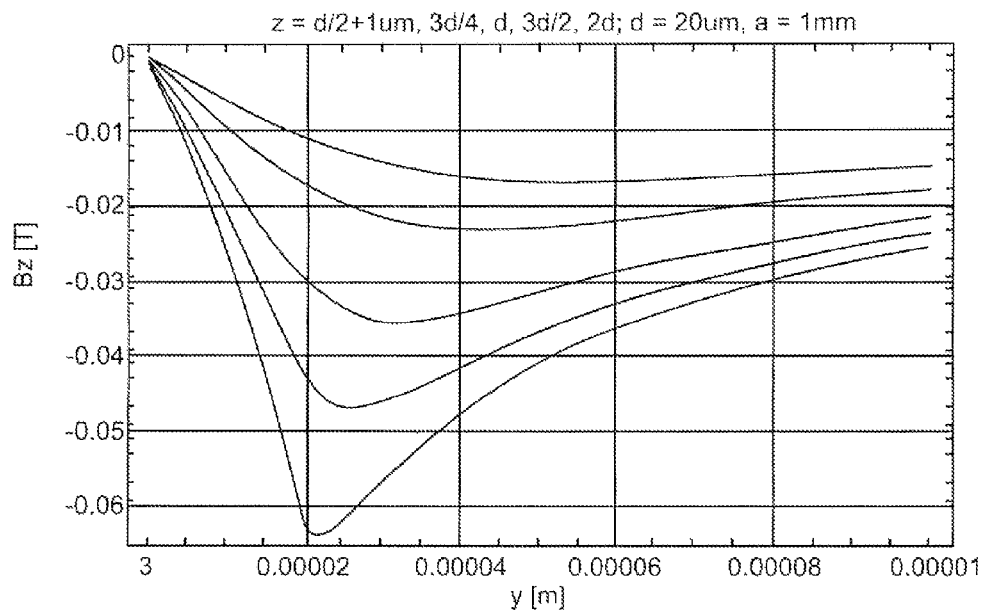
FIG. 4 is a plot of vertical flux densities according to an embodiment.
Figure 5:
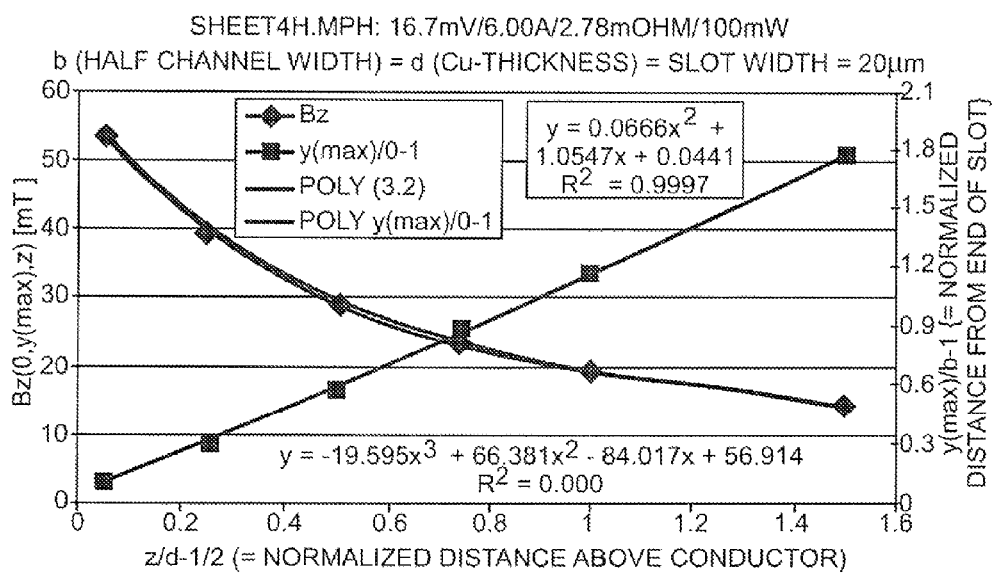
FIG. 5 is a plot of magnetic field versus isolation gap according to an embodiment.

FIG. 4 depicts the vertical flux density, Bz, at x=0 at various distances above conductor 102, where conductor 102 is about 20 μm thick and has a radius of about a=1 mm. The various distances are 1, 5, 10, 20 and 30 μm, with 20 mV applied to conductor 102 providing a current of 7.188 A and a power dissipation of 144 mW. As can be seen in FIG. 4, the field is strongest 1 μm above conductor 102, with the extreme field located at y=21 μm. The field is weakest 20 μm above the surface of conductor 102, where the extreme is located at about y=60 μm. Thus, the field decreases significantly across the isolation gap, and the point of maximum field goes to greater y. This can also be seen in FIG. 5, in which y(max) is the y-coordinate of the maximum and Bz is the maximum.

Figure 6:
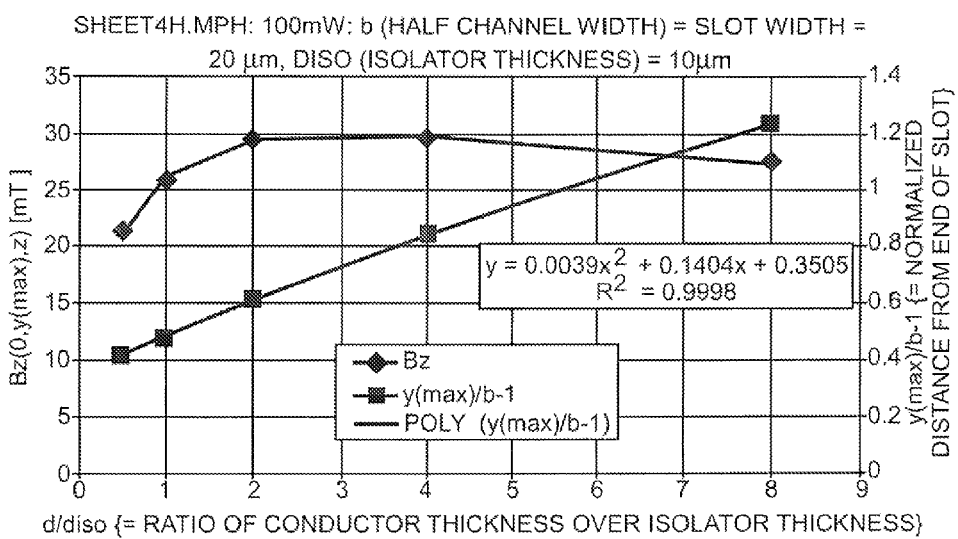
FIG. 6 is a plot of magnetic field versus a ratio of conductor thickness to isolation gap thickness according to an embodiment.
Figure 7:
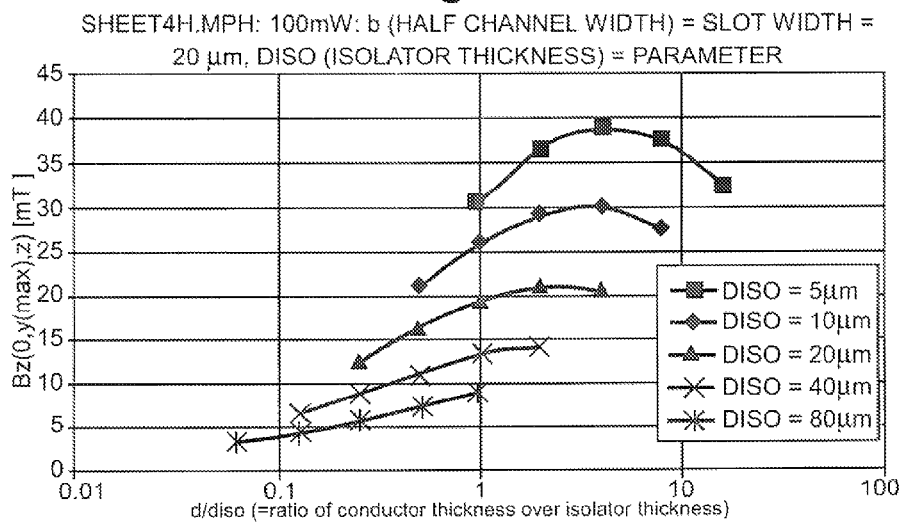
FIG. 7 is a plot of magnetic field versus ratios of conductor thickness to isolation gap thickness according to an embodiment.

Assuming a certain isolation gap, an optimum conductor thickness for constant power dissipation is desired. If conductor 102 is too thick, the magnetic field will decrease too much, and if conductor 102 is too thin, the resistance and dissipation will increase too much. Thus, an optimum conductor thickness can be predicted, as depicted in FIG. 6. In FIG. 6, bridge 112 is 40 μm wide, slots 108 and 110 are 20 μm wide and the isolation gap is 10 μm. With these conditions, the field is greatest when a ratio of conductor thickness to isolation gap is between 2 and 5. In other words, an optimum conductor thickness in embodiments is between two and five times the isolation gap width. If the isolation gap, diso, increases, the flux density, Bz, decreases yet the optimum conductor thickness, d, decreases only slightly and is larger than the isolation gap. Therefore, in an embodiment, the conductor thickness should be about twice the isolation gap width for a wide range of isolation gap widths as shown in FIG. 7.

Figure 9:
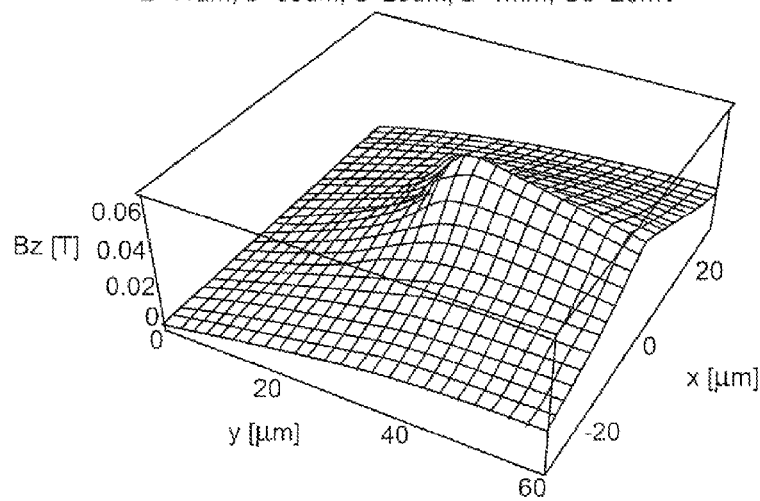
FIG. 9 is a diagram of magnetic field at a test point above a conductor according to an embodiment.

FIGS. 8 and 9 depict how quickly the magnetic field decreases if the test point is moved off conductor 102. In each of FIGS. 8 and 9, conductor 102 is 20 μm thick, bridge 112 is 60 μm wide and the radius of conductor 102 is a=1 mm. U0 is the voltage applied to the perimeter, at bond pads 114, giving rise to a certain current flowing through conductor 102. The vertical field component Bz is shown in Teslas, T, and evaluated at height z=20 μm in FIG. 8, which is 10 μm above the top surface of conductor 102 because the origin of the reference frame is in the midplane of conductor 102. In FIG. 9, z=11 μm, or 1 μm above the top surface of conductor 102. For convenience, only the right half, y>0, of the geometry is depicted, and the shape of conductor 102 with a slot 108 or 110 is shown as the top lightly cross-hatched plane in FIG. 8. Current streamlines are represented by black arrows, which is where, in one embodiment, sensor elements are placed in accord with the Bz-curve maximum.

Due to the sharp discontinuities of the fine slots, the current density becomes extremely inhomogeneous, as does the magnetic field. Therefore, embodiments are advantageous because narrower slots are better flux concentrators, increasing the magnetic field on the sensor elements and thus increasing the sensitivity of sensor 100 with respect to current to be measured. Further, the flux-concentrating properties of slots 108 and 110 have the added beneficial effect of avoiding far-reaching magnetic fields, reducing crosstalk and increasing the bandwidth of sensor 100.

With respect to reducing crosstalk, if two sensor elements are placed on an ordinary printed circuit board (PCB) in close proximity, e.g., side by side, as is often done in practice, it is important that one sensor not be disturbed by the magnetic field of the other. Sensors are typically not equipped with any soft magnetic material to provide shielding from external fields. Therefore, it is desired that the field of each sensor falls of sharply versus distance from the sensor element.

With respect to increasing bandwidth, the magnetic field of conductor 102 can induce eddy currents in nearby conductive components. These eddy currents give rise to secondary magnetic fields which can add up to and distort the original field. This effect gives rise to a frequency dependence of the signal in the magnetic sensor elements. For large bandwidths this is desired to be avoided.

As can be seen in FIG. 8, the magnetic field is large not only near the very end of slots 108 and 110 but also along a certain length of each slot 108 and 110. Therefore, it can be advantageous in embodiments to arrange magnetic field sensor elements along slots 108 and 100 as depicted in FIG. 8B. In embodiments comprising Hall plates, such as H1a, H1b, H2a and H2b in FIG. 8B, two or four plates can be connected in parallel with mutually perpendicular directions of Hall supply current in order to reduce Hall plate offset. It can therefore be advantageous, when multiple plates or elements may be used anyway, to arrange the plates in a single row beneath the slot 108, 110 and to choose a width of the slot 108, 110 comparable to the size of the Hall plates. Such a configuration can provide the smallest possible slot width and hence the largest possible magnetic field on the Hall plates, in an embodiment. In FIG. 8B, the arrows indicate current flow, and conductor 102 is arranged over Hall plates H1a, H1b, H2a and H2b with respect to the orientation on the page. W is a distance between the Hall plate pairs H1 and H2, while y is an axis running lengthwise through slots 108, 110, perpendicular to a width dimension, wep, of an end portion of slots 108 and 110 themselves.

Figure 10:
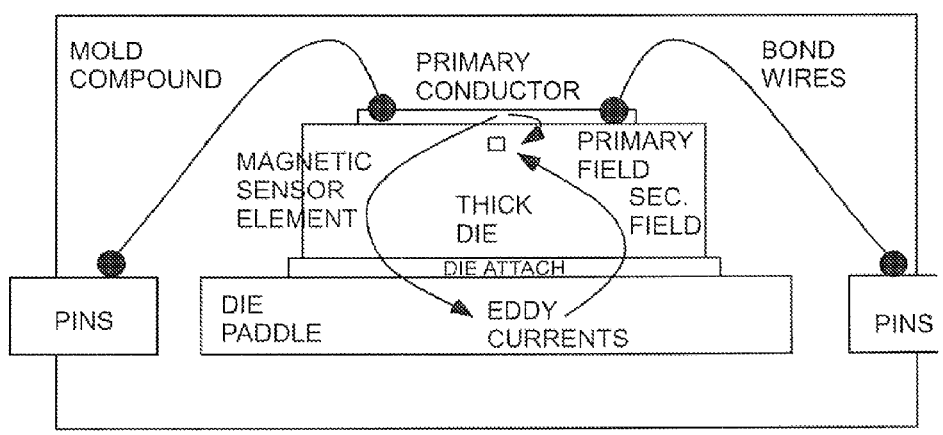
FIG. 10 is a cross-sectional block diagram of a package according to an embodiment.

In context and referring to FIG. 10, consider typical low-cost microelectronic device packaging. The semiconductor die is glued to a sheet metal, or the die paddle, the main part of the leadframe that holds the die in place during wire bonding. In wire bonding, fine bond wires are connected to bond pads on the die and pins of the leadframe. After bonding, the entire structure is overmolded to protect it mechanically from the environment. IN the case of a low current sensor, the current flows along one or several pins of the leadframe, across the bond wires onto the power-metal plane on top of the die and again via bond wires to the pins again. A problem can be presented by the die paddle: if the die paddle is exposed to a high frequency magnetic field of the conductor, the die paddle may carry eddy currents and introduce an error in the magnetic signals.

Embodiments discussed herein address this problem by making slots 108 and 110 in conductor 102 narrow enough to create highly inhomogeneous magnetic fields. These fields decay drastically versus distance such that only a small portion reaches the die paddle. This is the case especially when the die thickness is deliberately kept larger than usual. For example, the die is usually 0.2 mm thick in embodiments but could be up to, for example, 0.7 mm. The fields of these eddy currents have to travel all the way back through the thick die to where the sensor elements are located, reducing the final contribution of eddy currents in the sensor signals to negligible levels.

Figure 11A:
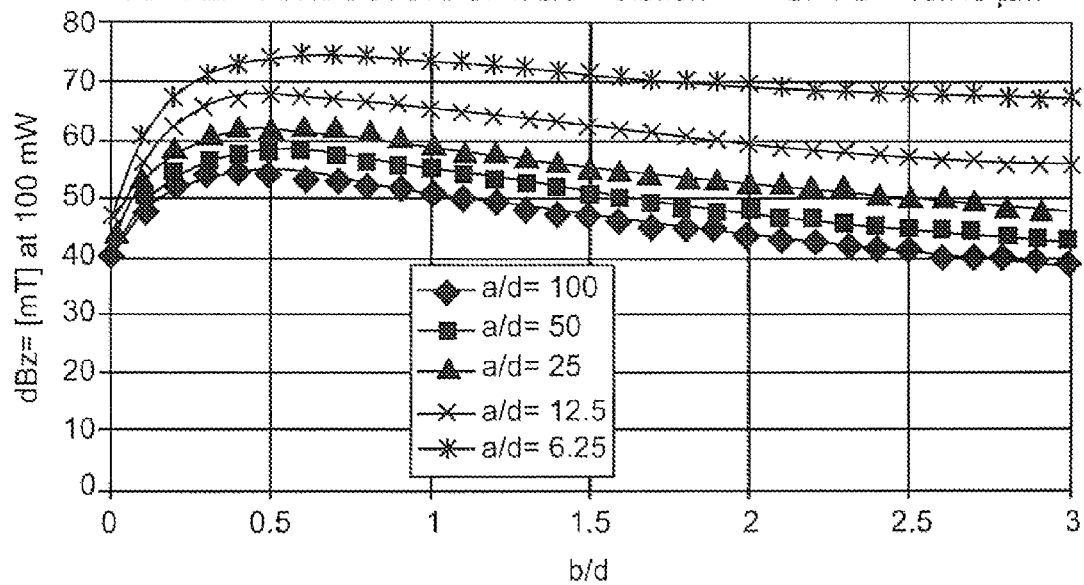
FIG. 11A is a plot of the difference in magnetic field at sensor elements proximate a bridge for various ratios of bridge width to conductor thickness according to an embodiment.

FIG. 11A is a graph related to determining an optimal width of bridge 112. As shown, an optimum width is about equal to the thickness, d, of conductor 102. If bridge 112 is slightly wider, such as by a factor of two to four, the loss in signal is still small, though in embodiments bridge 112 is not narrower than the thickness of conductor 102. In FIG. 11A, dBz is the difference in the magnetic field on the sensor elements on both sides of bridge 112, and a is the radius of primary conductor 102. The dissipation is kept at 100 mW for all curves of the plot for purposes of comparison.

Figure 11B:
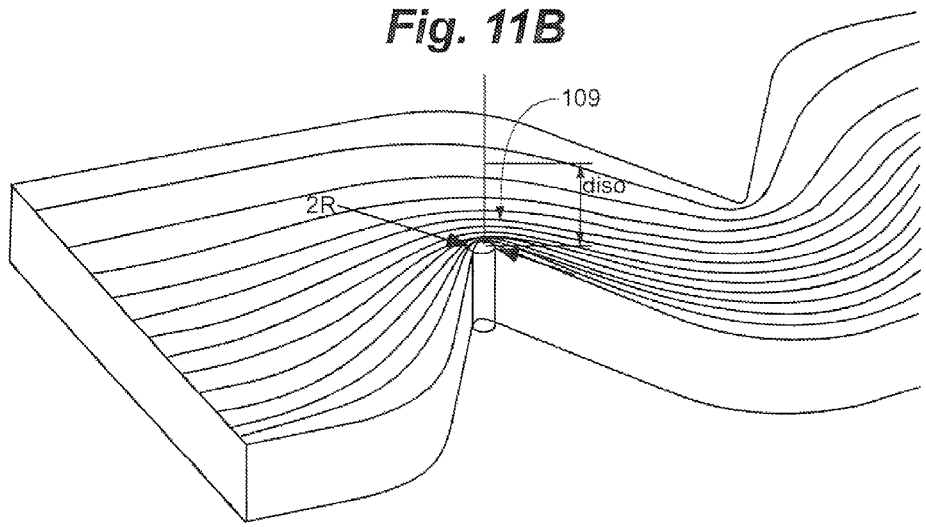
FIG. 11B is a perspective diagram of a conductor according to an embodiment.

The strongest current flowlines are generally those that flow closest to the tips of slots 108 and 110, along the radii of slots 108 and 110. Thus, the current in conductor 102 flows around roughly half of the cylindrical surface shown in FIG. 11B, which can be equated to a coil with a long, thin winding, where "long" is typically d>2R, where R is the radius of the slot. The configuration of the conductor in the embodiment of FIG. 11B is somewhat different from as otherwise depicted and discussed herein. Nevertheless, the principle of the current flow around the tips of the slots is the same.

Figure 11C:
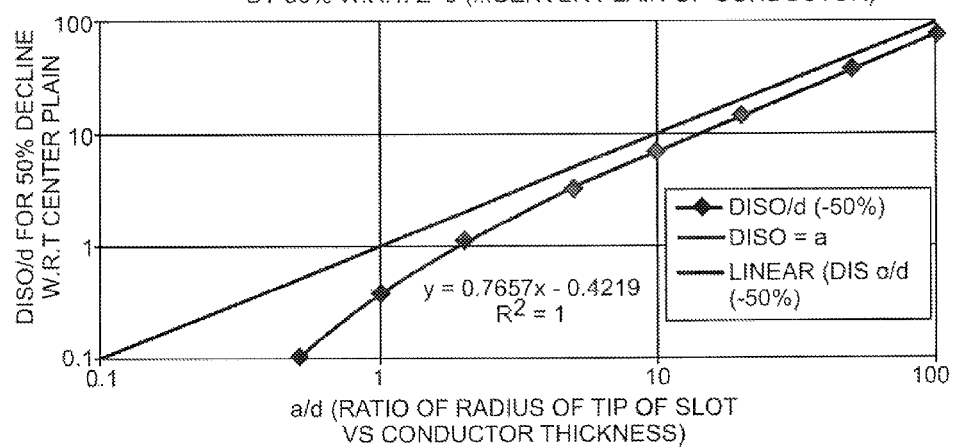
FIG. 11C is a plot of the declination of magnetic field at distances above a conductor according to an embodiment.

Returning to the "coil" analogy of the tips of slots 108 and 110, identified at 109 in FIG. 11B, in embodiments in with power metal on top of a semiconductor die, the winding of coil 109 is not thick and thus coil 109 is not long. This is because the tip radius is about the size of a Hall plate, such as about 100 µm in an embodiment, and the thickness of the power metal layer is about 5 µm to about 20 µm, yet the same equation applies such that the field along the axis of circular coil 109 is:

$$B_z = \frac{\mu_0 N I}{2d}\left(\frac{\frac{d}{2R}-\frac{z}{R}}{\sqrt{1+\left(\frac{d}{2R}-\frac{z}{R}\right)^2}} + \frac{\frac{d}{2R}+\frac{z}{R}}{\sqrt{1+\left(\frac{d}{2R}+\frac{z}{R}\right)^2}}\right)$$

where z=0 is the center of coil 109. From this equation the vertical distance at which the magnetic field has decayed to half its maximum in the center plane of conductor 102 as a function of tip radius and conductor thickness can be determined, as depicted in FIG. 11C. If the tip is large in relation to conductor thickness, then the field decays to half of its maximum value at diso=R. If the tip is small, the field decays to half of its maximum value at diso<<R. Therefore, R/d should be chosen carefully. If it is too small, then the field decays too rapidly versus distance and much is lost in the isolation layer. If it is too large, then it can lead to crosstalk and eddy currents, rather than increasing the field on the sensor elements, which can reduce the bandwidth of sensor 100. In embodiments, a ratio of R/d is in the range of about 0.5 to about 10.

Thus, and referring generally to FIGS. 5, 6, 7, 11A and 11C, an embodiment of a current sensor has an isolation gap (diso) of about 15 µm, a conductor thickness (d) of about 30 µm, a bridge width (2b) of about 30 µm, magnetic sensor elements of about 50 µm and thus a slot width of about 40 µm. In embodiments, the width of bridge 112 can be larger, such as up to about 200 µm, without significant loss of magnetic field yet at the risk of insufficient suppression of external magnetic fields.

Figure 12:
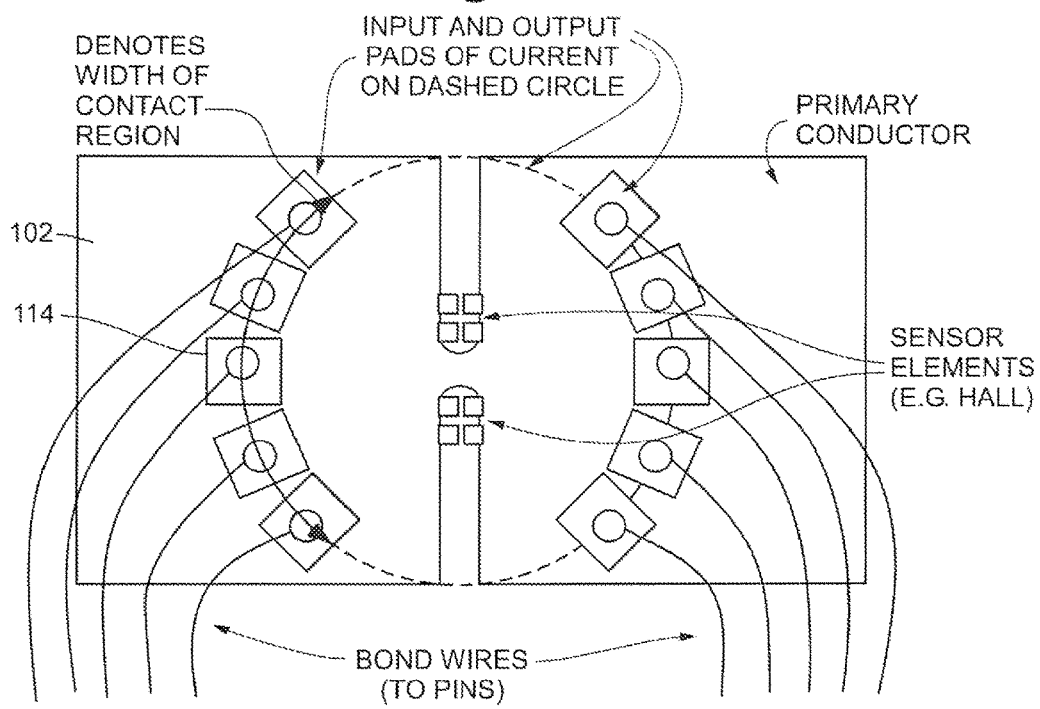
FIG. 12 is a block diagram of a conductor and contacts according to an embodiment.

The circumference of conductor 102 may vary, though it is important to consider the placement of bond pads 114 and 116 relative to the perimeter of conductor 102. In embodiments, bond pads 114 and 116 are arranged in a circle, with a common radius from the center of conductor 102. Conductor 102 need not be circular, however, as depicted in FIG. 12. The generally rectangular configuration of conductor 102 in FIG. 12 can cover a larger area extending beyond a circular arrangement of the bond pads, though the configuration depicted in FIG. 12 is but one example. The white arrow drawn through bond pads 114 represents the width of the contact region, which is defined by the pad opening of the bond pad, not by the actual contact area through the nailhead of the bond wire. If several bond pads are used in parallel, then the width means the distance of the outer edges of the outmost openings of bond pads as depicted. If the contact is made via bumps in flip-chip techniques, then the contact area is still defined by the pads on which the bumps are placed and not the bumps themselves. Thus, the contact area is typically wider than the physical contact through which the current flows.

Figure 13:
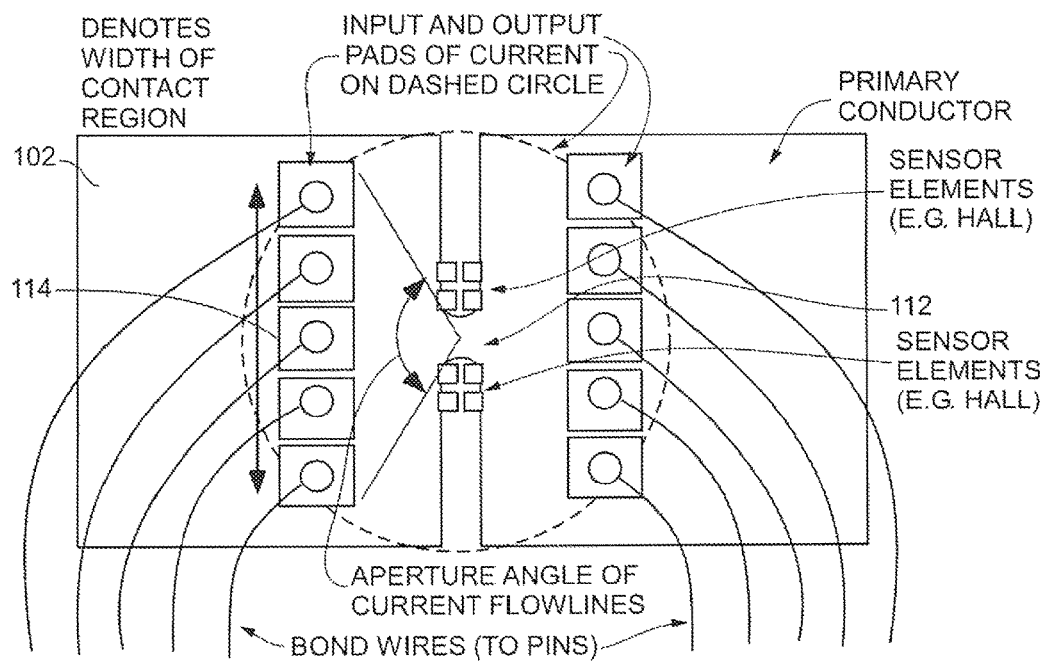
FIG. 13 is a block diagram of a conductor and contacts according to an embodiment.

Another embodiment is depicted in FIG. 13, in which the bond pads are arranged linearly. Such a layout can have a lower overall resistance, as the main portion of the current will flow through the bond wires closest to bridge 112, assuming all bond wires have similar resistances. While this is not good for the reliability of the bond wires, it does not present a problem for the current sensor itself.

In another embodiment, the pins are arranged so as to make the lengths of the bond wires equal to provide homogenous current density along the perimeter of conductor 102.

The diameter of conductor 102 in circular configurations depends at least in part on the area needed for the contacts. In general, however, it is advantageous to keep the diameter as small as possible. Thus, the circumference should not exceed the number of bond pads multiplied by the sum of the bond pad size and the minimum required pitch in an embodiment.

Additionally, a wide aperture angle, such as greater than about 90 degrees, of current flowlines also guarantees that the thermal resistance between hot spots, typically the edges of bridge 112 where the current density is highest, and the contact area is minimized. Thus, heat can be conducted easily to the ambient through the contacts, avoiding overheating of sensor 100 at high currents.

Further, it is possible to solder clips to the front side of the die instead of using bond wires. In such an embodiment, such as the one depicted in FIG. 14, the die is equipped with a so-called solderable front side. In FIG. 14, only a right-side copper clip 120 is depicted, though in practice an identical second clip would be included on the left side of conductor 102. In embodiments comprising clips, the number, size and placement of bond pads can vary. In one embodiment, a plurality of bond pads are larger and arranged under clip 120 along a circular path centered on bridge 112. Other configurations can be used in other embodiments.

Referring generally to the various embodiments discussed herein, a commonality is that the contact area in each is much wider than a width of bridge 112 yet still close to bridge 112. No matter the particular geometry, this means that the current lines in conductor 102 are radially arrayed and directed toward the center of bridge 112. The current streamlines spread with an aperture angle of more than 90 degrees as seen from the center of bridge 112 to the outside. This provides the excessive current density close to the edges of bridge 112 because whenever the current flowlines change direction sharply, higher current density results which in turn provides large, inhomogenous magnetic fields nearby. Thus, embodiments endeavor to shape the current flowlines such that they change direction abruptly, and then to position magnetic field sensors nearby.

The degree of abruptness has to be chosen carefully. If sharp corners are used, with a radius of curvature on the order of a µm, excessive current density could be produced but the magnetic field would be localized around the corner within a distance of only several µm, which could not be sensed by a common sensor element with a size of about 100 µm. Design rules usually prohibit large areas of metal on the surface of a die because it can provide reliability problems, such as shear stress at the mold compound interface, a delamination hazard. To avoid this and other problems, additional fine slots 122 can be introduced into conductor 102 in embodiments, such as those depicted in FIG. 15, so long as the slots are aligned with the current flowlines, i.e., in a radial direction. Slots 124 can also be introduced between two or more of the bond pads.

Figure 16A:
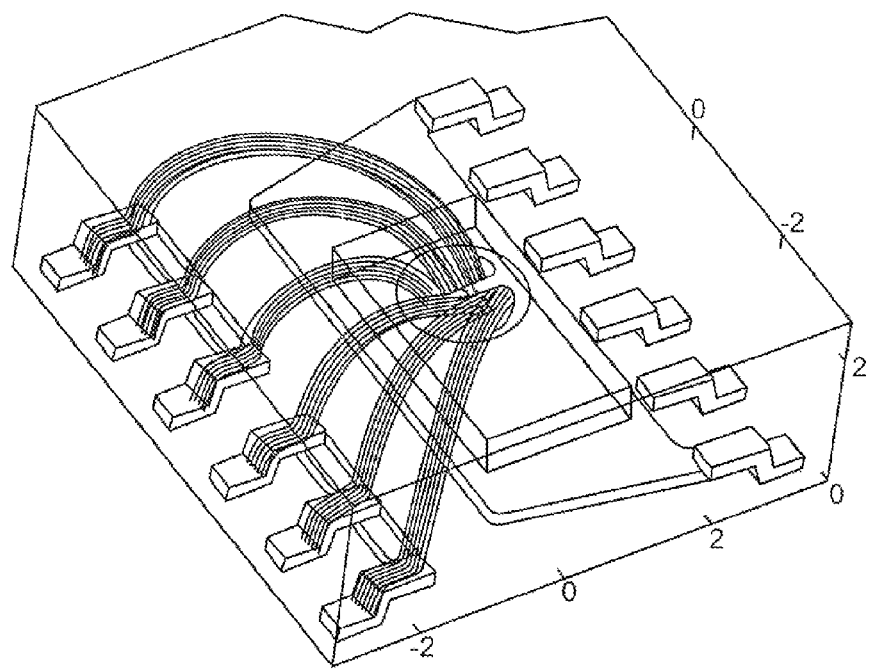
FIG. 16A is a three-dimensional diagram of a conductor coupled to package pins by bond wires according to an embodiment.
Figure 16B:
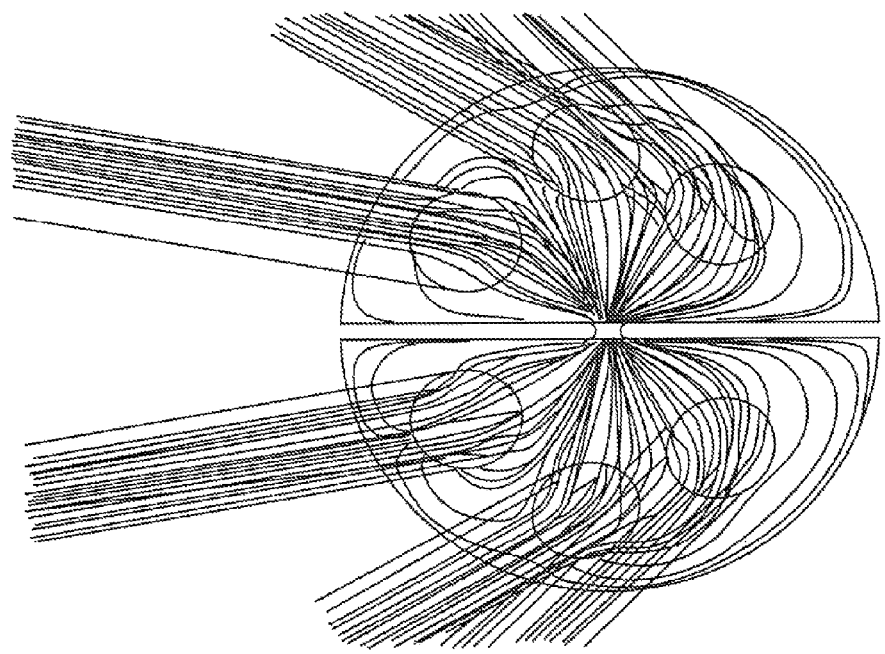
FIG. 16B is a top view diagram of the embodiment of FIG. 16A.
Figure 16C:
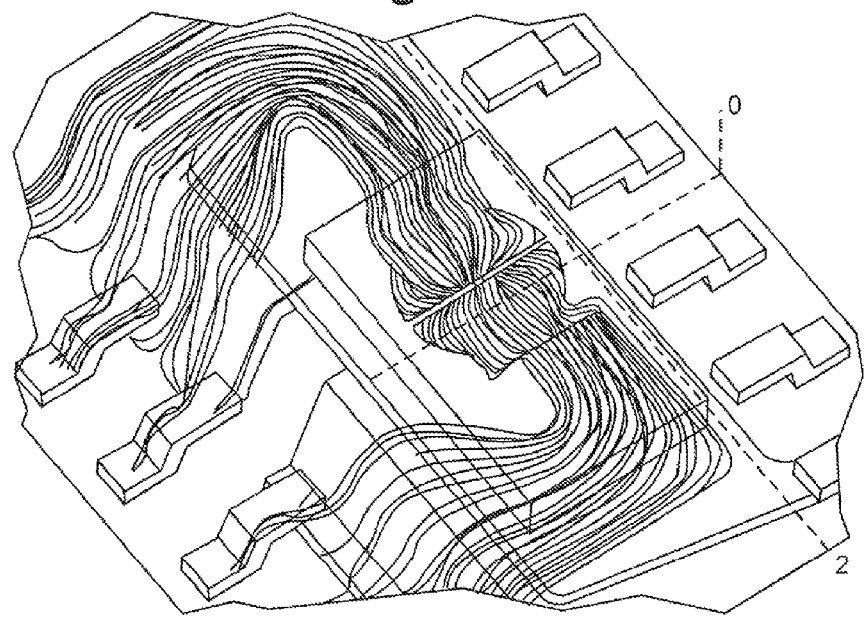
FIG. 16C is a three-dimensional diagram of a conductor coupled to package pins by a clip according to an embodiment.

Conductor 102 can present current limitations, however, given that all current in conductor 102 passes through narrow bridge 112. For example, in an embodiment in which bridge 112 is about 50 µm wide and conductor 102 is about 20 µm thick, the resistance can be about 5 mΩ, which can limit currents in excess of 10 A. This can present challenges in embodiments in which a current of up to about 30 A or more is desired. Additionally, in order to have the contact area needed for the bond wires the wires are bonded a certain distance from bridge 112. This distance can increase the path of the current flow lines and thereby also increase the internal resistance. Similar challenges can occur in embodiments utilizing clips, as discussed above with reference to FIG. 14. Refer also to FIGS. 16A-C, in which current streamlines can be seen in bond wires (FIGS. 16A and 16B) and a clip (FIG. 16C).

Figure 16D:
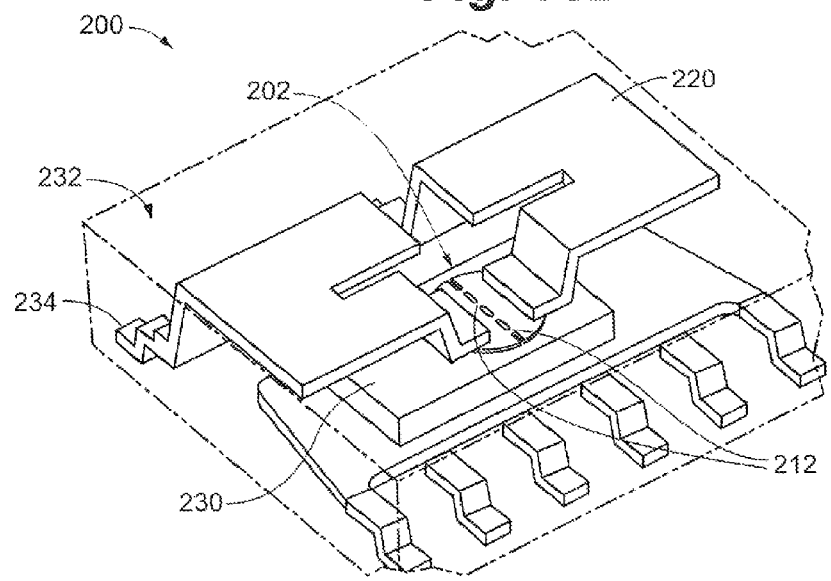
FIG. 16D is a three-dimensional diagram of a sensor according to an embodiment.
Figure 17A:
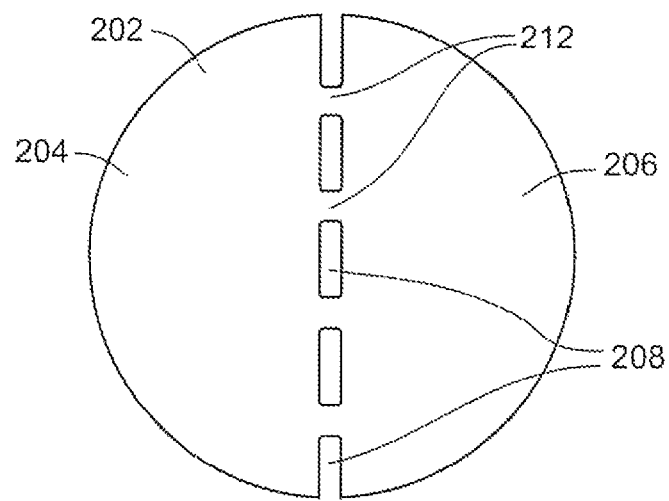
FIG. 17A is a block diagram of a conductor according to an embodiment.
Figure 17B:
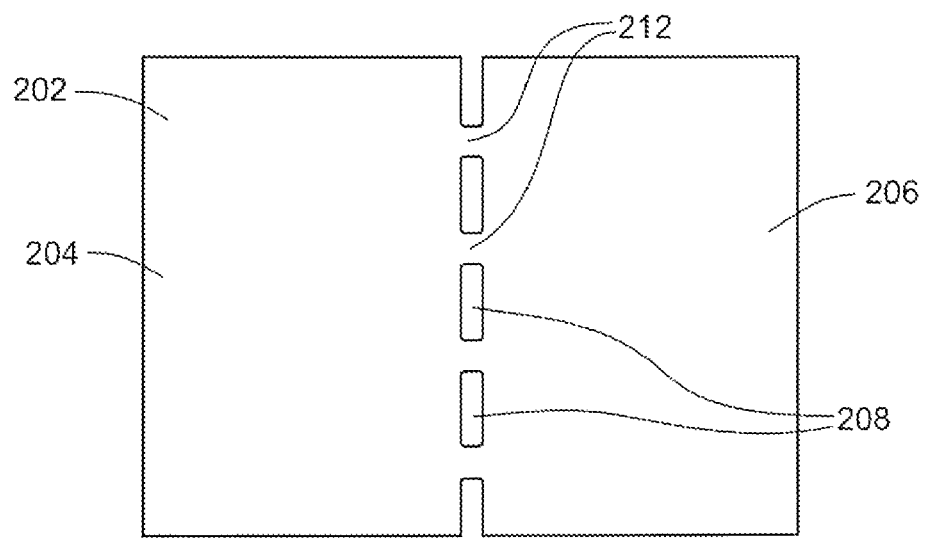
FIG. 17B is a block diagram of a conductor according to an embodiment.
Figure 18A:
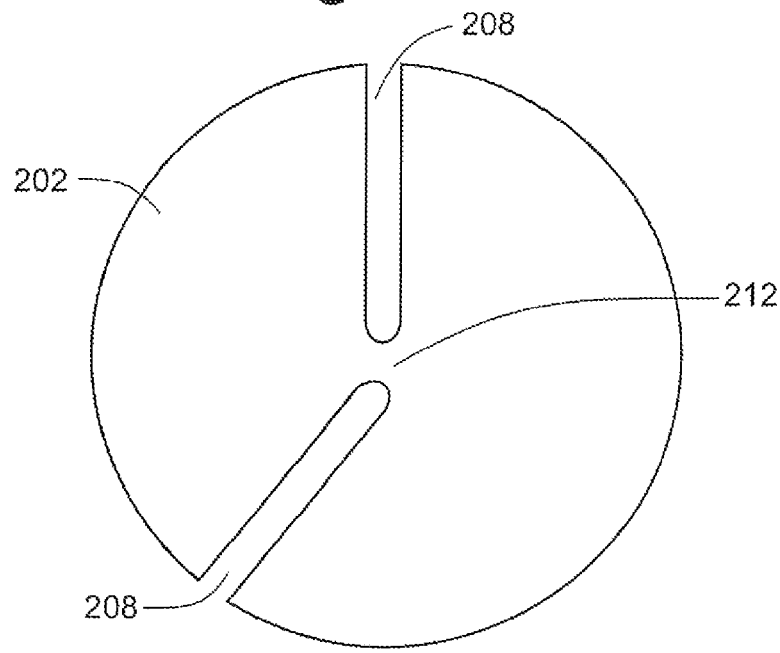
FIG. 18A is a block diagram of a conductor according to an embodiment.
Figure 18B:
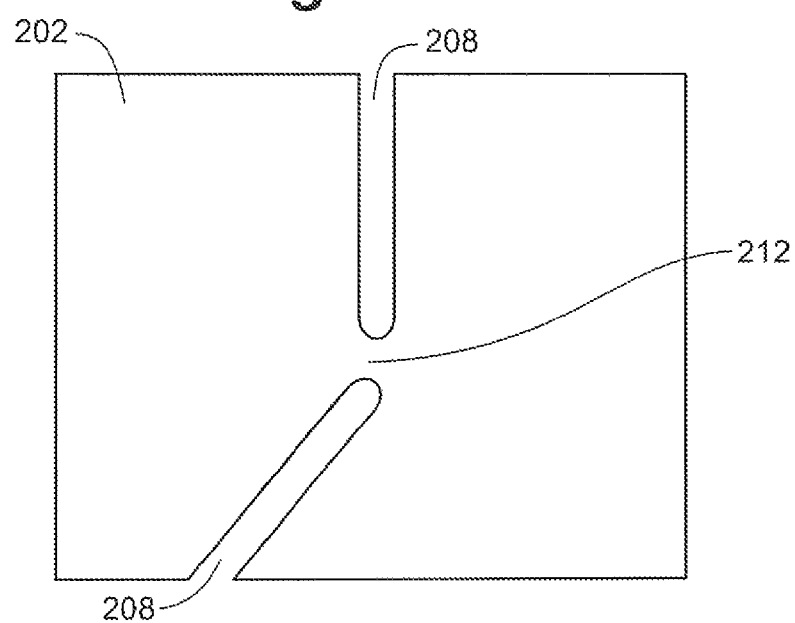
FIG. 18B is a block diagram of a conductor according to an embodiment.
Figure 18C:
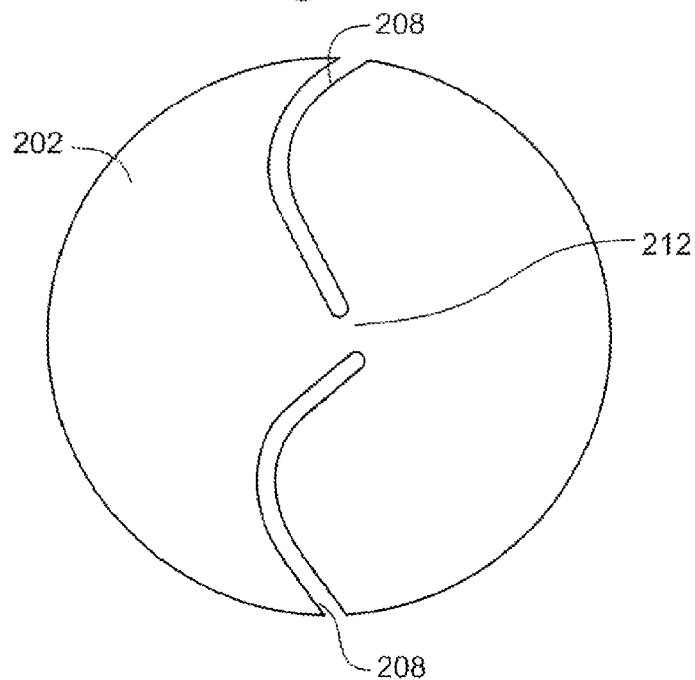
FIG. 18C is a block diagram of a conductor according to an embodiment.
Figure 18D:
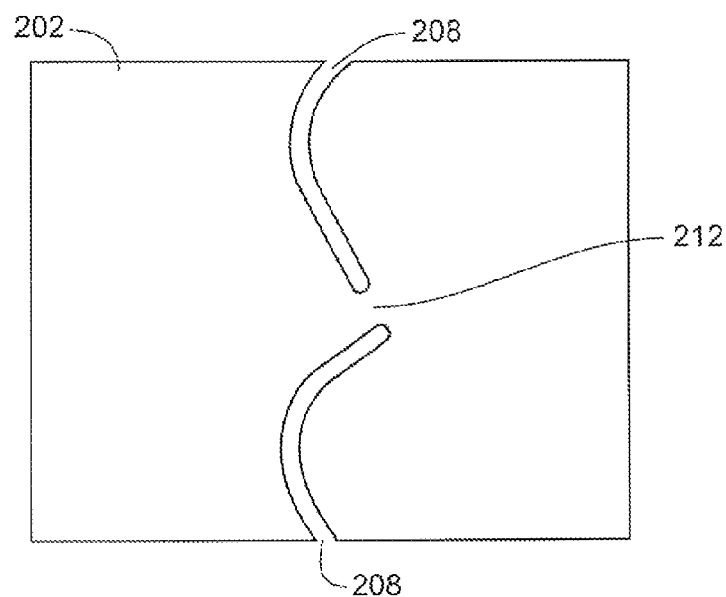
FIG. 18D is a block diagram of a conductor according to an embodiment.
Figure 18E:
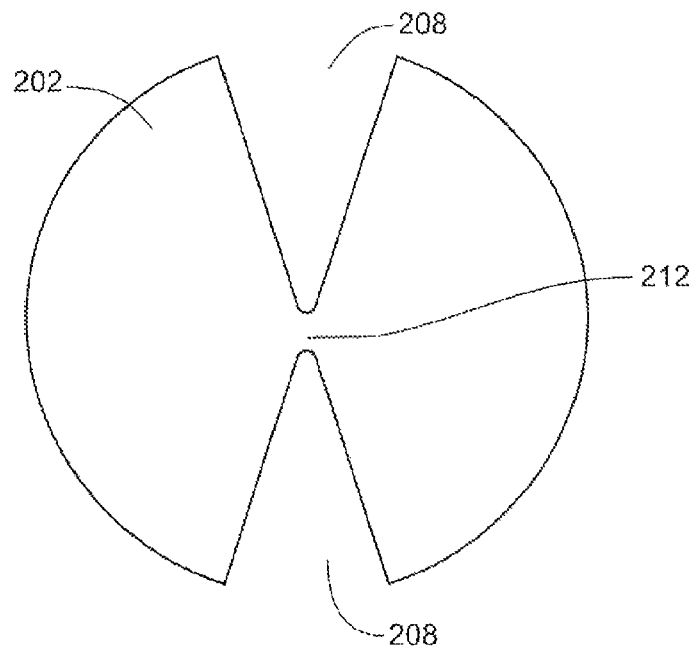
FIG. 18E is a block diagram of a conductor according to an embodiment.
Figure 18F:
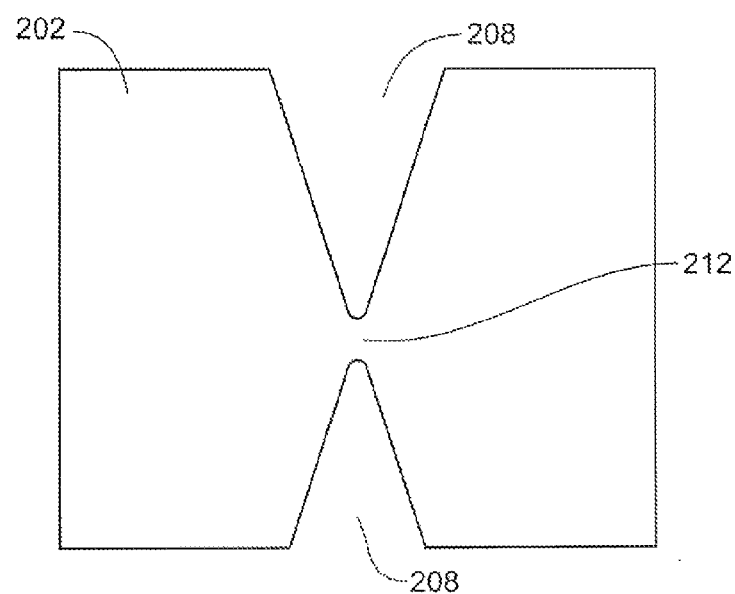
FIG. 18F is a block diagram of a conductor according to an embodiment.

Thus, and referring to FIG. 16D, additional modifications can be made in embodiments in order to further reduce resistance in the conductor. In particular, conductor 202 comprises a plurality of bridges 212 separated by a plurality of slots 208 (see FIGS. 17 and 18) in an embodiment. Conductor 202 can be circular as depicted in FIG. 17A, rectangular as depicted in FIG. 17B, or some other suitable shape. The configuration of slots 208 can also vary, as depicted in FIG. 18. The number of bridges 212 can vary in embodiments, though in general conductor 202 comprises at least two bridges 212. The embodiments of FIGS. 16D and 17 comprise four bridges 212, for example. In embodiments, bridges 212 are evenly distributed across a width of conductor 202 and arranged along a common axis. The configuration of the axis can vary in embodiments, such as being straight, curved, zig-zagged and other configurations.

Similar to conductor 102, conductor 212 comprises a sheet metal on top of the semiconductor die 230. Conductor 212 can be processed during the front-end manufacturing process of the semiconductor. In embodiments, conductor 212 comprises aluminum, a power metal such as copper, or some other suitable material. Conductor 212 can also comprise a stack of various conductors and/or materials having various thicknesses and therefore different lithographic accuracies. Conductor 212 is between about 10 µm and about 200 µm in embodiments. In various embodiments, a top surface of conductor 212 is covered to a great extent by metal in order to spread temperature homogenously in operation.

In another embodiment, conductor 212 can be attached to die 230 after front-end processing, wherein conductor 212 comprises a nano-paste applied to the wafer, such as via ink jets and baked out at low temperatures of about 300 degrees C. In embodiments, the exact position of the nano-paste with respect to semiconductor die 230, on whose surface there are magnetic field sensor elements and a signal processing circuit, is much more subtle.

Similar to conductor 102, conductor 202 comprises a first portion 204 and a second portion 206. Portions 204 and 206 are coupled to each other via a plurality of bridges 212, separated by slots 208, and to external pins 234 of a package 232 by bond wires, clips 220 as depicted in FIG. 16D, or some other coupling means. In the embodiment of FIG. 16D, conductor 202 can comprise various layers in order to implement a solderable front side of die 230, providing a reliable soldering junction between the sheet metal of conductor 212 and clip 220. Clip 220 can comprise copper or some other suitable material in various embodiments.

In embodiments, bridges 212 are each about 10 µm to about 100 µm wide, such as about 50 µm in an embodiment, though bridges 212 can be wider or narrower in other embodiments, and a length of bridges 212 is less than twice the width. In an embodiment, bridge 212 is less than 1 mm wide. Crosstalk from external currents and magnetic fields can be reduced if the width of bridge(s) 212 is kept small in embodiments. Because the nearest currents are generally at least several millimeters away, the magnetic field sensors associated with bridge 212 can be spaced apart less than 1 mm. Thus, in an embodiment, bridge 212 has a width of less than about 1 mm, such as less than about 100 µm.

Slots 208 have rounded tips with radii of curvature in embodiments. The smaller the radius, the greater the current density in embodiments. Therefore, there are limits on the radius of curvature, as it is desired to have high current density but in a targeted area of an active of a magnetic field sensor, as discussed elsewhere herein, in order to avoid interference with neighboring sensor elements. In an embodiment, the radii of curvature of slots 208 are at least 20% of the length of bridges 212. In another embodiment, a lateral or width dimension of an end of slot 208 is at least 10% the length of bridge 212 and less than about two times the length of bridge 212.

Figure 19A:
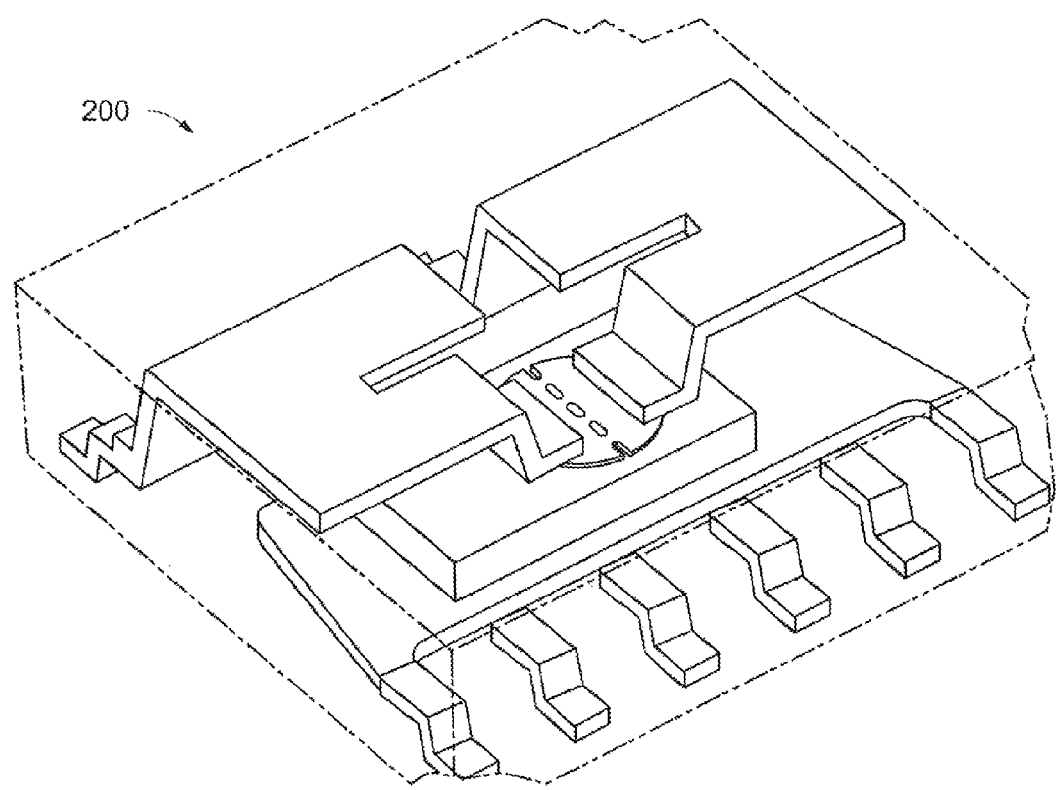
FIG. 19A is a three-dimensional diagram of a sensor according to an embodiment.
Figure 19B:
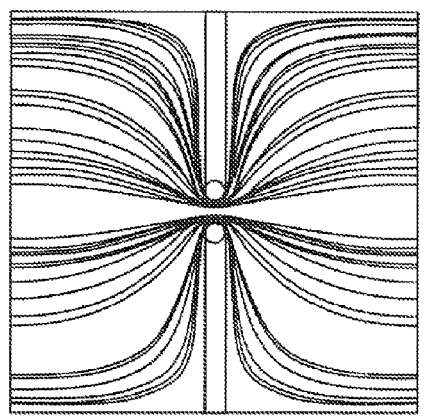
FIG. 19B is a plot of current flowlines in a conductor according to an embodiment.
Figure 19C:
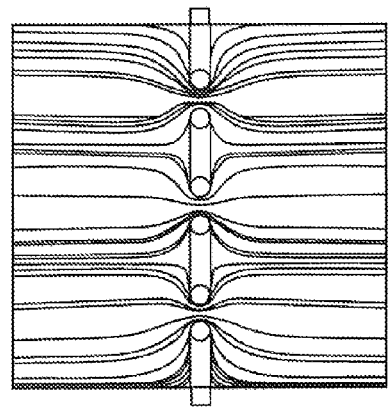
FIG. 19C is a plot of current flowlines in a conductor according to an embodiment.
Figure 19D:
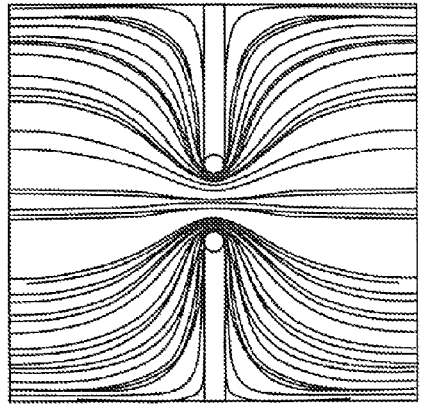
FIG. 19D is a plot of current flowlines in a conductor according to an embodiment.
Figure 19E:
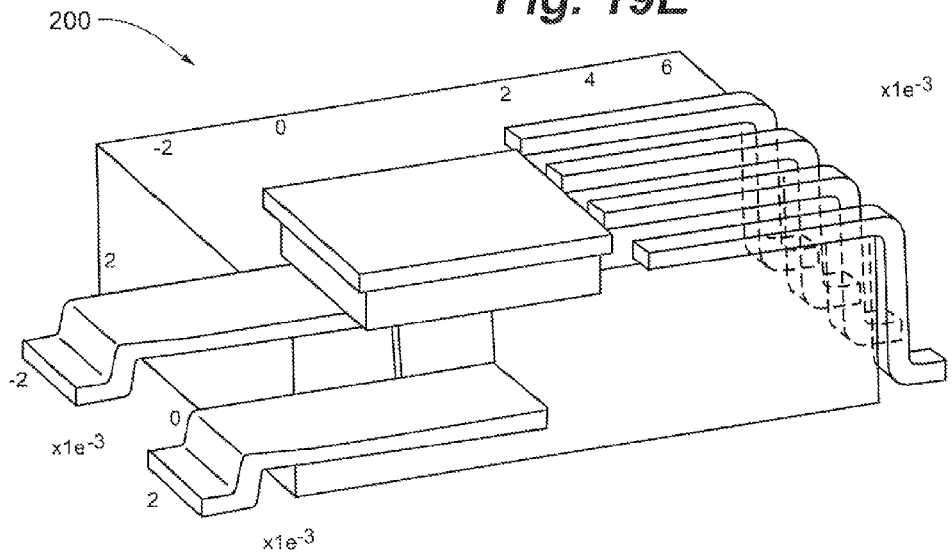
FIG. 19E is a three-dimensional diagram of a sensor according to an embodiment.
Figure 19F:
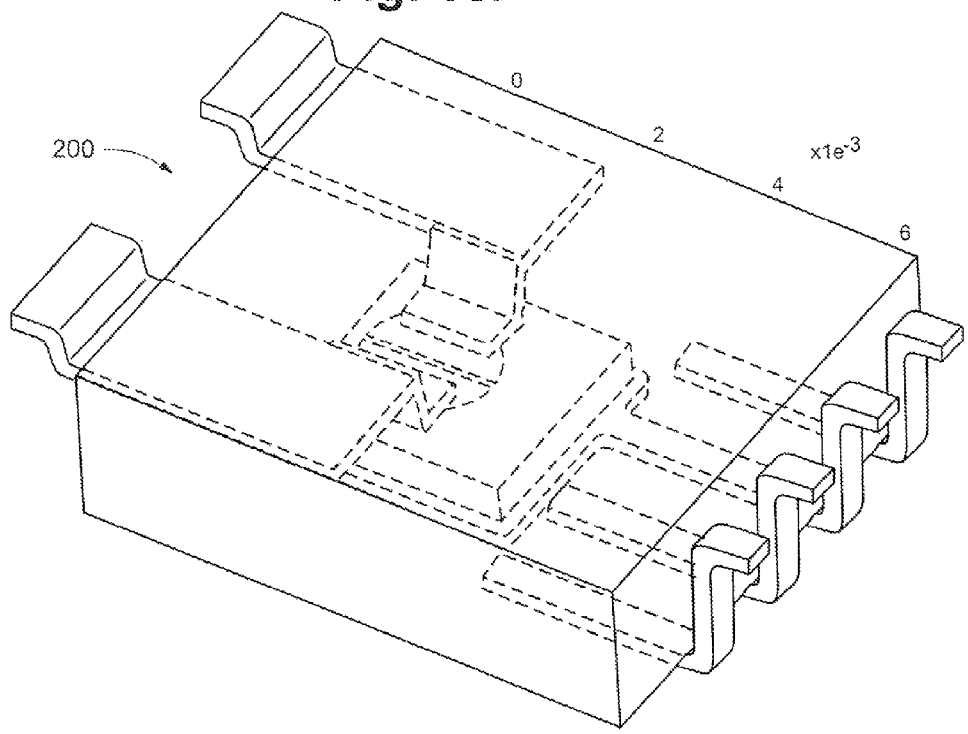
FIG. 19F is a three-dimensional diagram of a sensor according to an embodiment.

The plurality of bridges 212 are connected electrically in parallel, allowing the total current in conductor 202 to be split into roughly equal parts through each bridge 212. In the embodiment of FIGS. 16D, 17 and 18 having four bridges 212, the resistance is only one-quarter of the resistance of a single bridge embodiment. The reduction in resistance will vary according to the number of bridges 212, as understood by those skilled in the art. Another beneficial aspect of this configuration is the fact that bridges 212 are distributed along the entire length of the edges of clips 220, such that the current streamlines do not have to change direction when they leave or enter clips 220, in contrast with single-bridge embodiments discussed previously. Advantages can also be provided over conventional designs in which artificial boundary conditions are imposed on current in conductor 202. In other words, conductor 202 is designed in embodiments to interfere as little as possible with current flow, which leaves the current free to find the shortest path. With the current streamlines finding the shortest path while remaining essentially parallel to one another, the resistance is further reduced. Current streamlines in situ can be seen in FIG. 19A, with comparison views in FIG. 19B (single bridge), FIG. 19C (three bridges) and FIG. 19D (single bridge three times wider than the bridge of FIG. 19A), and additional three-dimensional views of sensor 200 are depicted in FIGS. 19E and 19F.

FIG. 20 depicts a plot of the current densities in bridges 212. The current densities are measured at the midplane of conductor 202, i.e., at y=0. As can be seen, the current densities in bridges 212 are similar, highest at the edges of the bridges and lowest in the center.

Figure 21A:
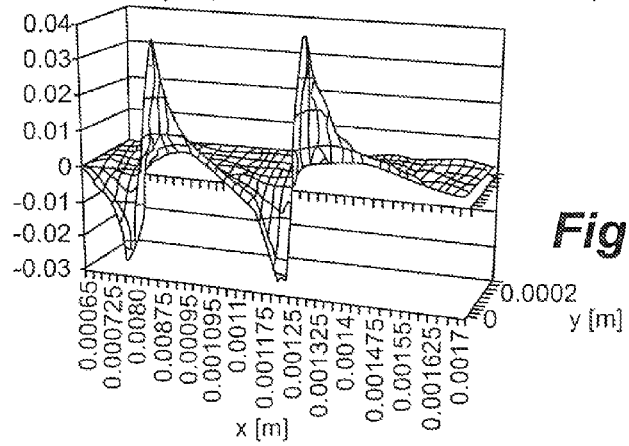
FIG. 21A is a plot of magnetic field according to an embodiment.
Figure 21B:
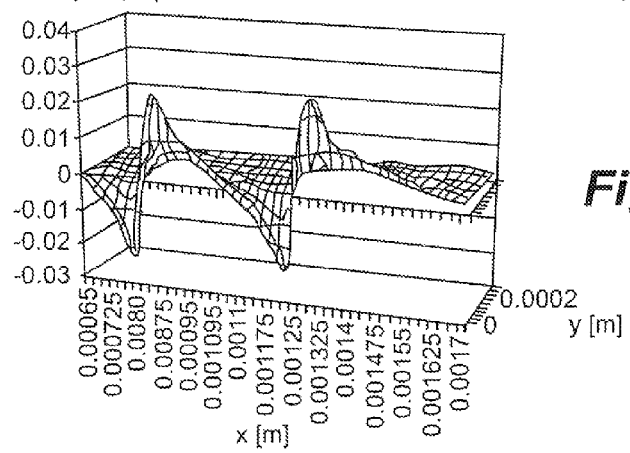
FIG. 21B is a plot of magnetic field according to an embodiment.
Figure 21C:
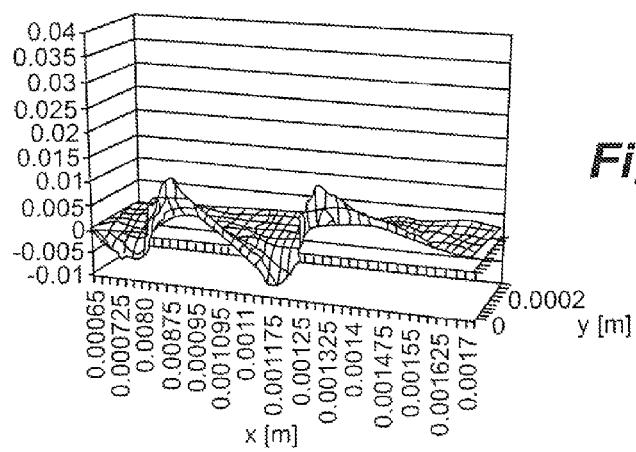
FIG. 21C is a plot of magnetic field according to an embodiment.

FIG. 21 depicts the magnetic field, Bz, at various distances above or below conductor 202. In FIG. 21A, the distance is z=10 µm, which is on the surface of conductor 212 when conductor 212 is 20 µm thick. FIG. 21B shows Bz at z=20 µm, 10 µm above the surface of conductor 212. FIG. 21C shows Bz at z=50 µm, 40 µm above the surface of conductor 212. As can be seen in FIG. 21, Bz is negative at a first side of each bridge 212 and positive at the other side, and the bridges 212 do not interact significantly, as adjacent ones of bridges 212 are spaced appropriately. This is illustrated by the fact that the field at the outer bridges is about the same as the field at the inner bridges, with "inner" meaning those closest to the center of conductor 212 and "outer" those closest to the perimeter of conductor 212, regardless of the shape of conductor 212. This holds true so long as the distance between adjacent bridges 212 is larger, by some degree, than the width of each bridge 212.

Figure 22:
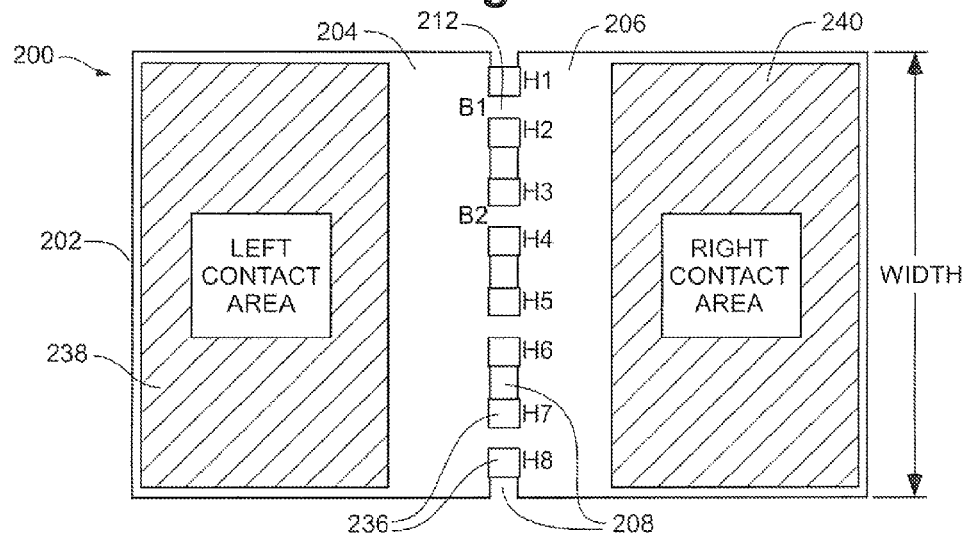
FIG. 22 is a block diagram of a current sensor according to an embodiment.

Referring to current sensor 200 in FIG. 22, a magnetic field sensor 236 is placed proximate each bridge 212. In other embodiments, one or more sensors 236 are placed proximate only some of the bridges 212. If the signal of a sensor element 236 is strong enough, sensor elements 236 are not needed at each bridge 212, so long as the current distribution between bridges 212 is stable enough over temperature and lifetime.

The sensors 236 can also be considered to be arranged relative to the tips or ends of slots 208 to sense vertical field components concentrated in the areas of the die adjacent the ends of each slot 208. Alternatively, the dimensions and configuration of slots 208 are selected in embodiments to correspond with the dimensions and configuration of the sensor elements. Thus, if an area of amplified magnetic field due to increased current density near an end of a slot 208 is Am and an area of each sensor element is As, then Am is equal to about 20% to about 500% of As in embodiments. A sensor element 236 can be a single Hall plate or a duplet or quadruple of Hall plates, such as is used to reduce the offset of the Hall plates. The size As of a single Hall plate is the size of the active area of the device. The size As of a multitude of Hall plates is the circumscribed region around all active areas of the individual Hall plates. Am denotes only the size of the area where the flux density is significantly increased but does not denote a location with respect to conductor 202 or a relative position of sensor elements 236 with respect to conductor 202. In embodiments, Am is only used to determine how large the end of the slot should be. It does not describe where sensor elements 236 themselves should be arranged. Additionally, and referring to FIG. 18, the slots need not be linearly arranged or aligned and may be laterally or linearly shifted, shaped or otherwise disposed in a variety of manners. The arrangement of the slots 208 will also affect the arrangement of one or more bridges 212, and vice-versa. In general, and as discussed elsewhere herein, where the width of bridge 212 is much less than the length, the resistance of conductor 202 will increase, which is generally not desired.

Magnetic field sensors 236 sense the vertical field component, the component perpendicular to the plane of the sheet metal of conductor 202. The first bridge B1 has sensors H1 and H2 placed above and below (with respect to the orientation on the page) the edges of bridge B1. If current passes from a left contact area 238 to a right contact area 240, the magnetic field affecting sensor H2 is directed into the drawing plane while the field is directed outward with respect to the drawing plane at sensor H1, in accordance with the right-hand rule. Thus, the signal H2−H1 is twice the signal H2. The field of the current through bridge B1 on sensor H3 is opposite to the field of the current through bridge B2 on sensor H3, though as previously mentioned the effect is negligible so long as the distance between bridges B1 and B2 is sufficient. The overall current in sensor 200 can be expressed as follows:

$$(H1+H3+H5+H7)-(H2+H4+H6+H8)$$

where contact area 238 is the high current side and contact area 240 is the low current side. This high/low configuration can be reversed in other embodiments.

Figure 23:
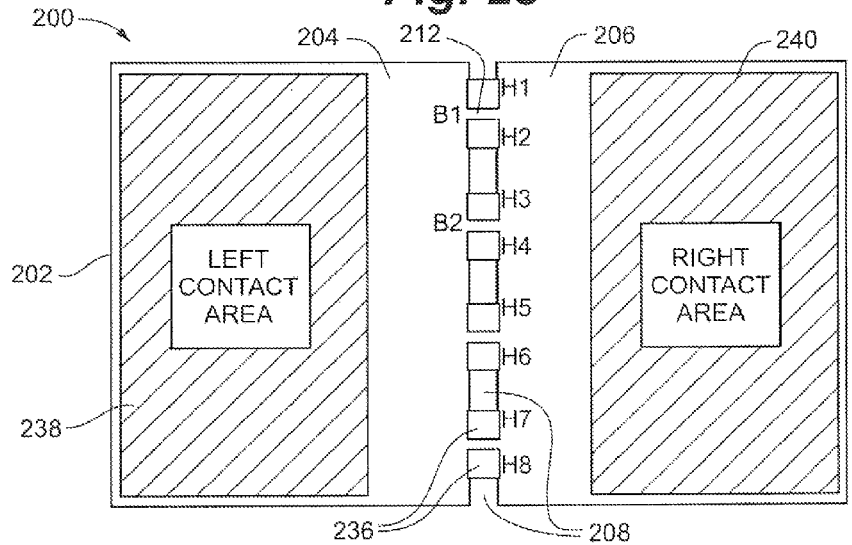
FIG. 23 is a block diagram of a current sensor according to an embodiment.

In an embodiment depicted in FIG. 23, each of sensors H1 and H2 at least partially overlaps bridge B1. In other words, sensors elements adjacent a particular bridge, such as elements H1 and H2 adjacent bridge B1, are positioned closer to each other. Such a configuration, nearly side by side, can improve the matching of the sensor elements, because the closer the sensor elements are the better the matching due to increased uniformity of doping profiles and accuracy of masks, parallelism of mask edges, and the like. It is also desired that sensors 236 experience the same temperature and mechanical stresses in order to minimize the residual offset due to thermomagnetic and piezoelectric effects. In embodiments, an area of each one of the magnetic sensor elements Hn substantially overlaps or covers an area of an end portion of a slot 208, regardless of whether the orientation places the sensor elements Hn over or under the conductor. Further, adjacent conductors can cause inhomogeneous magnetic fields, which can be better suppressed if adjacent sensor elements Hn and Hn+1 are positioned more closely together.

Figure 24A:
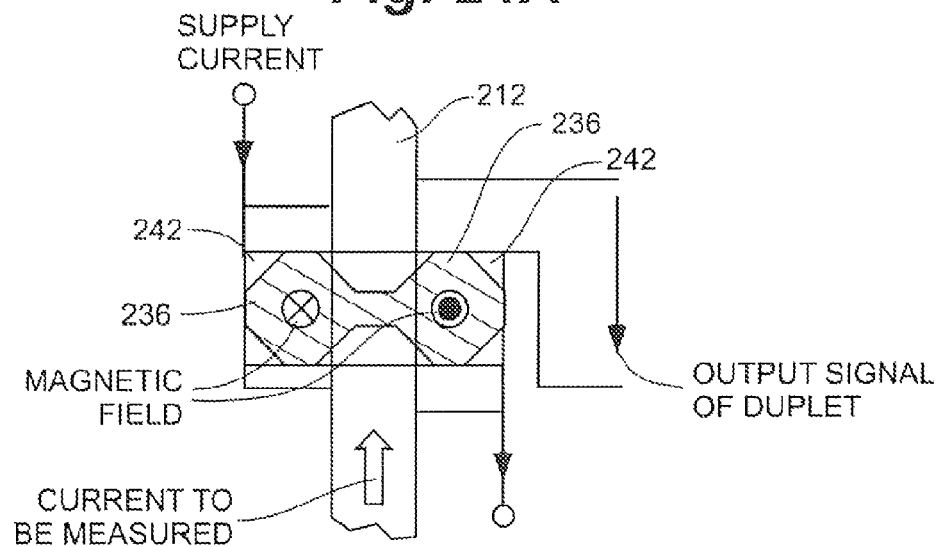
FIG. 24A is a block diagram of sensor elements according to an embodiment.
Figure 24B:
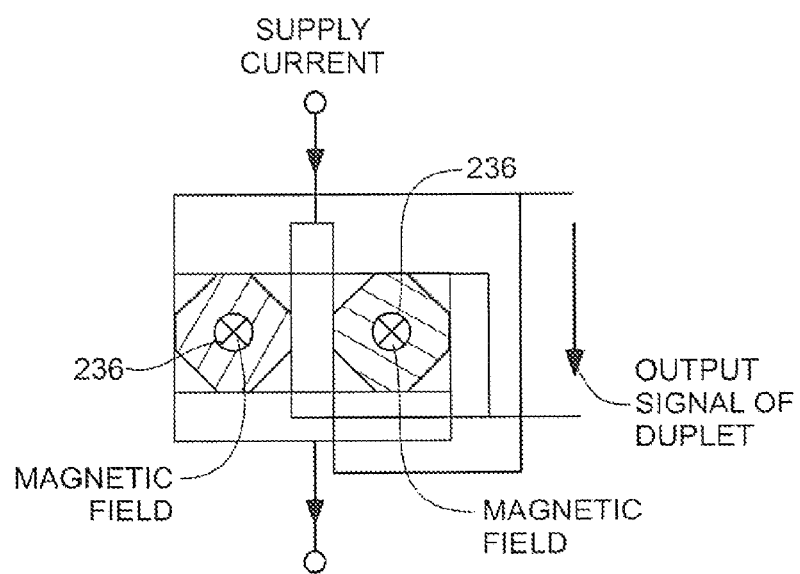
FIG. 24B is a block diagram of sensor elements according to an embodiment.

Referring to FIG. 24A, another layout of sensor elements 236 is depicted. In order to reduce the offset of Hall elements, it is known in the art to place two or more elements close to each other and connect them in such a way that the current flows in perpendicular directions through each Hall element, and the output signals are averaged. Refer, for example, to FIG. 24B. This is called a duplet. In embodiments of sensor 200, it is desired to save space, because the magnetic field is so concentrated that it can only be sampled with a single Hall element. Therefore, the duplet is split into two parts in an embodiment, with one Hall element at the left side of a bridge and the other at the right side of the bridge. Because the output signals are subtracted, it must be ensured that the direction of current flow through both plates is parallel, which effectively subtracts the offsets of both plates. Due to the narrowness of the bridges, the Hall sensor elements are close to each other so that their systematic offset cancels while at the same time the signal from the current to be measured doubles. In FIG. 24A, Hall sensor elements 236 are square, though circular, oviform, rectangular, octagonal or crossed configurations can be used in other embodiments. Contact areas for the supply current and output signals are depicted at 242. Comparing FIGS. 24A and 24B, the configuration of FIG. 24A shows that the magnetic field on the sensor elements 236 are in parallel but opposing directions, while in FIG. 24B the fields have the same direction.

In an embodiment, it is desired for contact areas 238 and 240 to be wide with respect to conductor 202, with a separation distance between areas 238 and 240 as small as possible to reduce the current path and thereby the resistance. In an embodiment, a width of conductor 102 is essentially the same as contact areas 238 and 240.

In an embodiment, sensor 200 further comprises an isolation layer between conductor 102 and the rest of the semiconductor circuit. In embodiments, the isolation layer varies between about 10 μm and about 200 μm thick, depending on the technology of the layer. Conductor 202 therefore has a certain vertical distance, or isolation gap, to sensor elements 236. In embodiments, the isolation gap is narrower than the thickness of conductor 202 to avoid reduction in the magnetic field, as previously discussed.

Figure 25:
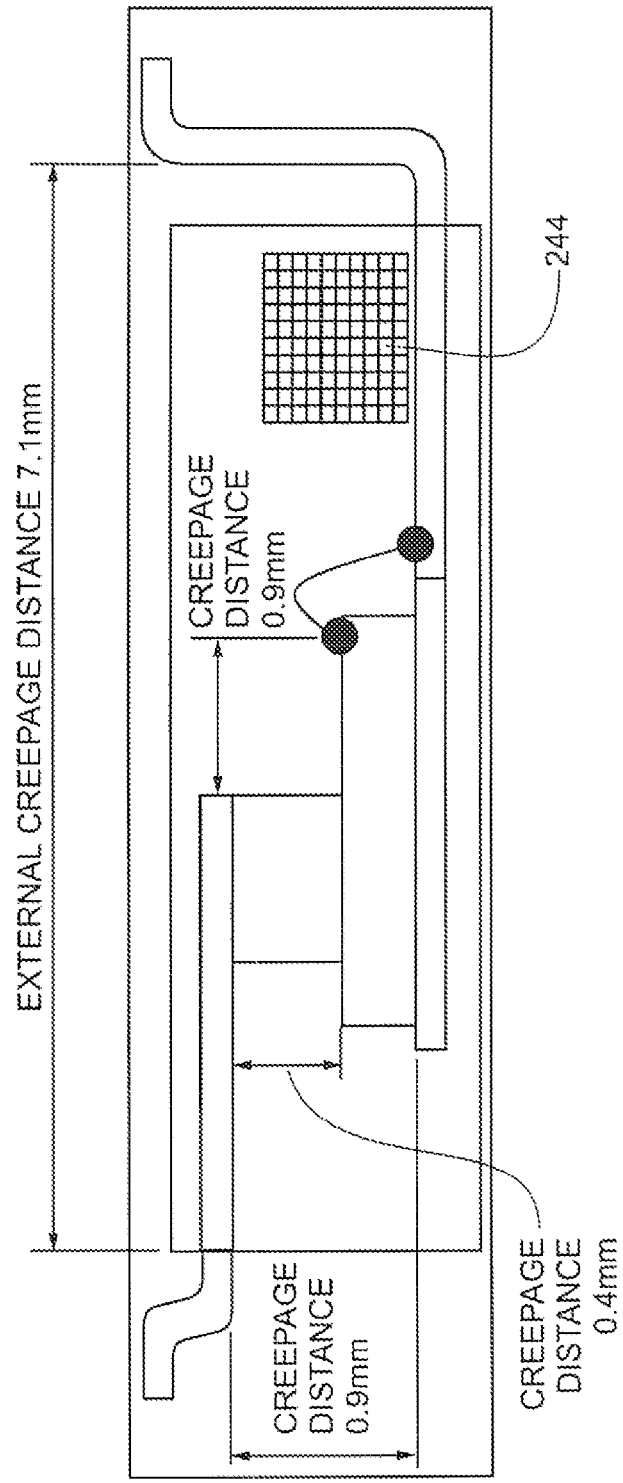
FIG. 25 is a side view of a sensor according to an embodiment.

FIG. 25 depicts various creepage distances that also can be considered. The creepage distances can relate to the bond wires, clip 220 and other components of sensor 220. For example, additional creepage distances include a lateral creepage distances between clip 220 and sawing edges. The various creepage distances can vary from the example embodiment depicted in FIG. 25.

FIG. 25 also depicts a capacitor 244. Capacitor 224 can fill additional space within the package while also being used to stabilize the supply or output. Capacitors often have magnetic components, however, which can interfere with the magnetic field of sensor elements 236. Therefore, the choice of a particular capacitor should be carefully considered in embodiments in which capacitor 224 is included. To this end, it can be advantageous for a semiconductor manufacturer to add capacitor(s) in the package prior to calibration in end-of-line testing. It may also be advantageous can also be realized if the design and selection of capacitor(s), including the decision whether to include one or more, be undertaken by the manufacturer.

Figure 26A:
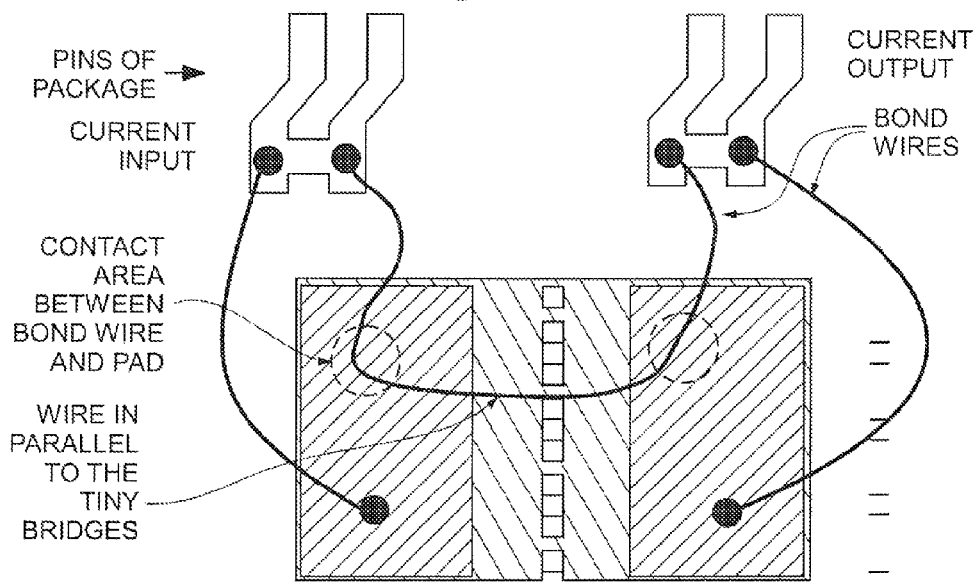
FIG. 26A is a top view diagram of a sensor according to an embodiment.
Figure 26B:
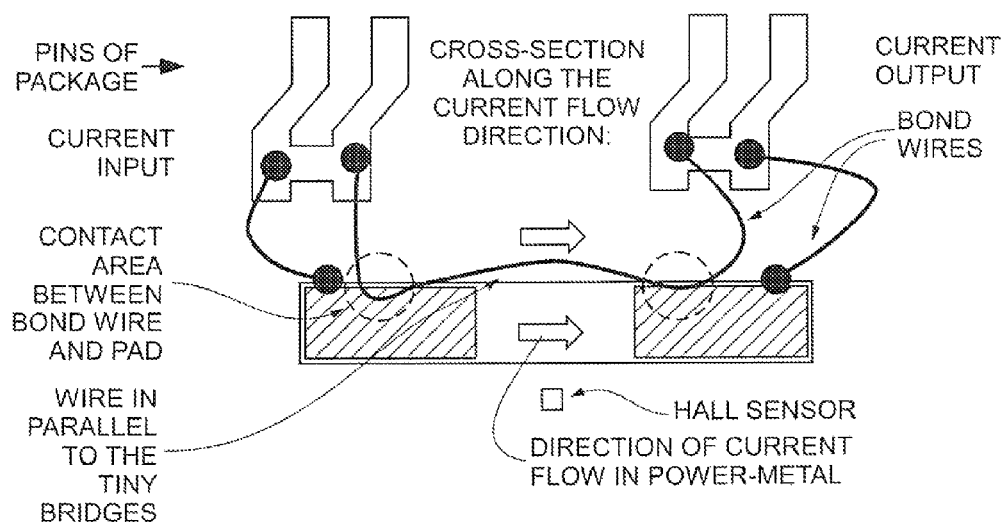
FIG. 26B is a side view diagram of the sensor of FIG. 26A.
Figure 26C:
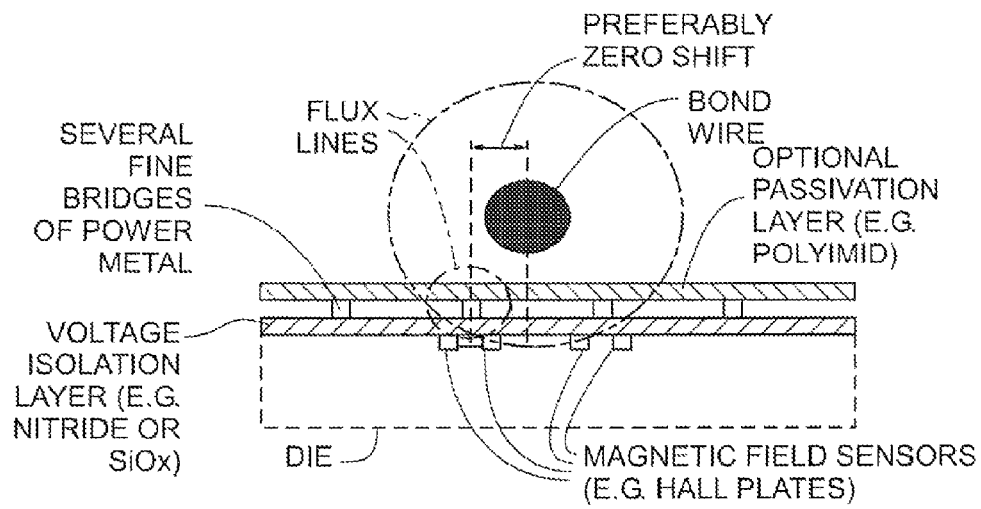
FIG. 26C is a side view diagram of a sensor according to an embodiment.

FIG. 26 depicts another embodiment in which bond wires electrically in parallel with bridges 212 are used to further reduce the internal resistance. The bond wires can be used to shunt part of the current away from bridges 212 which can reduce the internal resistance. An additional advantage can be achieved if the wire loop is flat, or close to the power metal layer of conductor 202 and aligned with one of the bridges 212, because the current in the wires and conductor 202 can be added, as can be seen in FIG. 26B. These wires, however, can also be associated with magnetic fields that act on sensor elements 236, as depicted in FIG. 26C.

Figure 27:
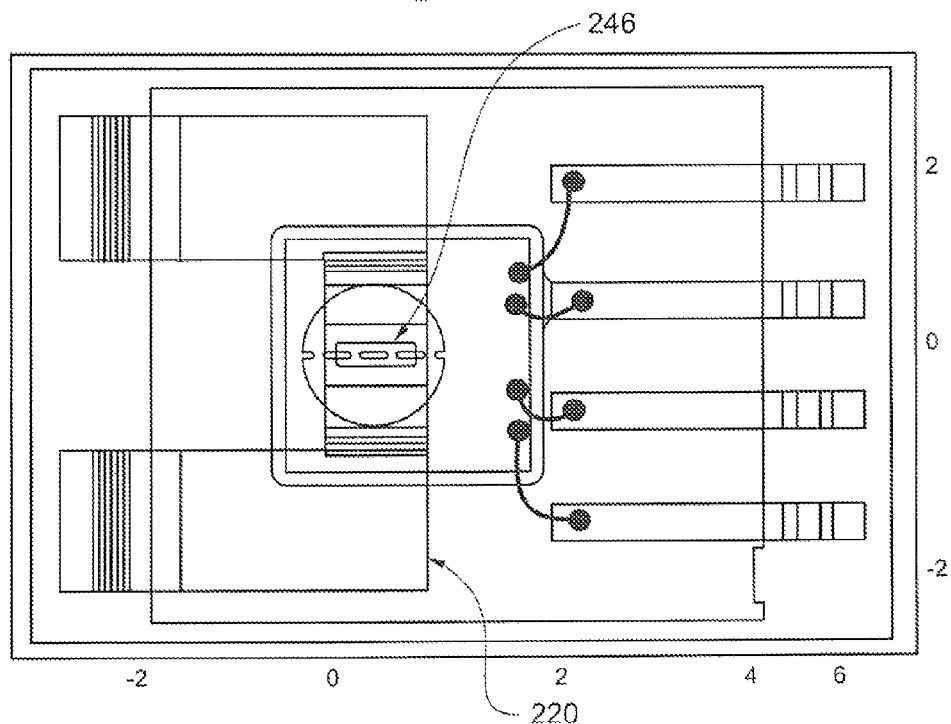
FIG. 27 is a top view diagram of a sensor according to an embodiment.

Another opportunity for reducing the electrical resistance while still keeping the magnetic field comparatively high is to modify clips 220. Referring to FIG. 27, a single piece clip 220 having a window 246 can be used. The current flows partly through clip 220 and partly through the power metal of conductor 202, particularly in the center of window 246, because there the path for flowlines through conductor 202 is significantly shorter than to go via the left and right wings of clip 220.

Another advantage of shunting part of the current through clip 220 or bond wires is that these embodiments allow for thinner power-metal layers in conductor 202. Thick power metal layers are more expensive due to the long processing time during manufacturing, such as in galvanic deposition of copper layers.

Figure 28:
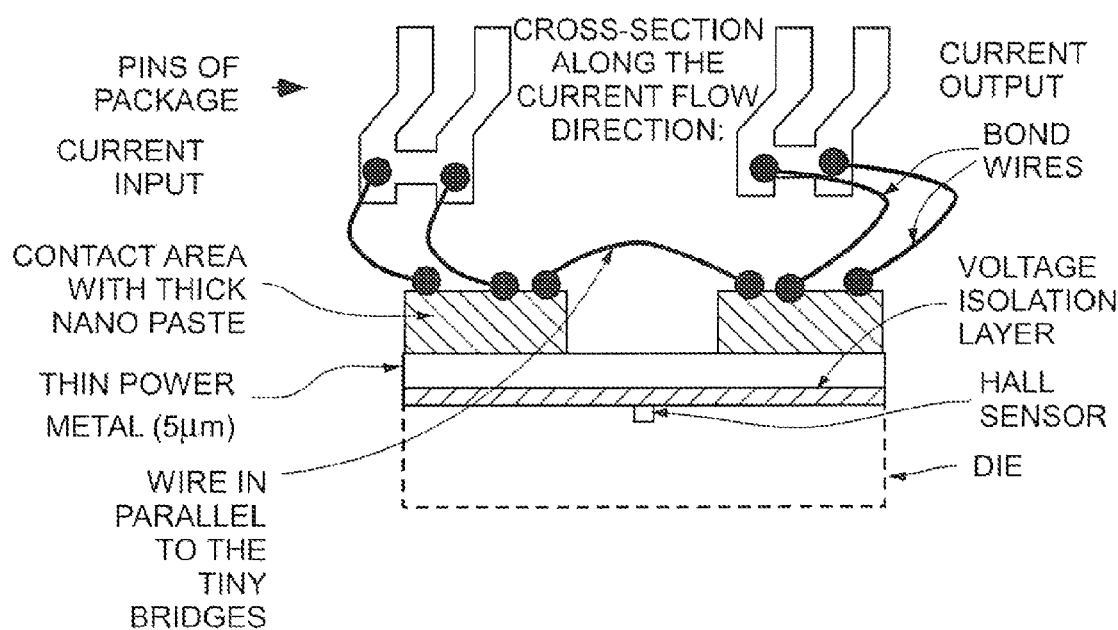
FIG. 28 is a side view diagram of a sensor according to an embodiment.

Referring to FIG. 28, another possibility for reducing the thickness of the power metal, such as to about 5 μm in an example embodiment, is to add nano-paste in the contact areas while keeping power-metal only near the bridges. In embodiments, the nano-paste can have a thickness of about 20 μm to about 100 μm or more. A comparison of FIGS. 26 and 28 shows that, in the embodiment of FIG. 26, a single bond wire is used to make contact from a current input pin to the left contact area over the bridges to the right contact area and a current output pin, whereas in the embodiment of FIG. 28, a current path is established by three separate bonds in series. An advantage of a single bond wire embodiment is reduced contact resistance and increased reliability.

Embodiments thereby provide current sensors having conductor geometries which provide reduced resistance while remaining suitable for integration in standard microelectronic packages. For example, a current sensor can comprise a conductor having a circular configuration, with at least one bridge coupling first and second portions of the conductor. In embodiments, the length of the bridge can be smaller than twenty percent of the diameter of the conductor, and/or slots formed in the conductor can have rounded tips with radii of curvature less than two times the length of the bridge separating them, and/or a vertical distance from the bridge to a die paddle is at least four times larger than a length of the bridge. Embodiments can also avoid far-reaching fields and cross-talk while being suitable for currents up to about 30 A. Additional advantages and benefits will also be appreciated by those skilled in the art.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A current sensor comprising:
   a leadframe;
   a semiconductor die coupled to the leadframe;
   a conductor comprising a metal layer on the semiconductor die, the conductor comprising at least one bridge portion and at least two slots, a first slot having a first tip and a second slot having a second tip, a distance between the first and second tips defining a width of one of the at least one bridge portion, wherein the conductor is separated from the leadframe by at least a thickness of the semiconductor die, and the thickness is about 0.2 millimeters (mm) to about 0.7 mm; and
   at least one magnetic sensor element arranged on the die relative to and spaced apart from the one of the at least one bridge portion and more proximate the conductor than the leadframe.

2. The current sensor of claim 1, wherein the leadframe comprises a die paddle, and the semiconductor die is coupled to the die paddle.

3. The current sensor of claim 2, wherein the semiconductor die is coupled to the die paddle by a die attach.

4. The current sensor of claim 2, wherein the leadframe comprises at least two pins coupled to the conductor.

5. The current sensor of claim 4, wherein the at least two pins are coupled to the conductor by bond wires.

6. The current sensor of claim 5, further comprising a mold compound substantially surrounding the current sensor with the at least two pins at least partially exposed.

7. The current sensor of claim 1, wherein the at least one magnetic field sensor element is spaced apart from the conductor by an isolation gap, and a ratio of a thickness of the conductor to the isolation gap is between about 0.5 and about 20.

8. The current sensor of claim 7, wherein the thickness of the conductor is in a range of about 5 μm to about 200 μm.

9. The current sensor of claim 8, wherein the thickness of the conductor is less than about 50 μm.

10. The current sensor of claim 8, wherein the width of one of the at least one bridge portion is about the same as the thickness of the conductor.

11. The current sensor of claim 1, wherein the at least one magnetic sensor element comprises at least one pair of magnetic sensor elements, wherein the at least one pair of magnetic sensor elements comprises Hall elements, and wherein the magnetic field on a first Hall element of a pair of magnetic sensor elements is in a first direction and the magnetic field on a second Hall element of the pair of magnetic sensor elements is in a second direction generally opposing the first direction.

12. The current sensor of claim 1, wherein the at least one pair of magnetic sensor elements comprises planar Hall plates having a sensitivity to magnetic field components vertical with respect to a die surface.

13. The current sensor of claim 1, wherein the conductor comprises a power metal.

14. The current sensor of claim 1, wherein at least one of the first or second tips has a radius of curvature.

15. The current sensor of claim 14, wherein the radius of curvature is greater than or equal to about twenty percent of a length of the at least one bridge portion.

16. The current sensor of claim 15, wherein the length of the at least one bridge portion is less than about twenty percent of a diameter of the conductor.

17. A method of forming a current comprising:
   providing a leadframe having a plurality of pins;
   coupling a semiconductor die to the leadframe;
   forming a conductor comprising a metal layer on the semiconductor die, the conductor comprising at least one bridge portion and at least two slots, a first slot having a first tip and a second slot having a second tip, a distance between the first and second tips defining a width of one of the at least one bridge portion, wherein the conductor is separated from the leadframe by at least a thickness of the semiconductor die, and the thickness is about 0.2 millimeters (mm) to about 0.7 mm;

coupling the conductor to at least two of the plurality of pins;

arranging at least two magnetic sensor elements in the die relative to and spaced apart from the at least one bridge portion and more proximate the conductor than the leadframe; and enclosing the leadframe, the semiconductor die, the conductor and the at least two magnetic field sensor elements in a package such that at least a portion of the plurality of pins are exposed from the package.

18. The method of claim 17, wherein the enclosing comprises applying a mold compound as at least a portion of the package.

* * * * *